(12) United States Patent
Saito

(10) Patent No.: US 9,905,689 B2
(45) Date of Patent: Feb. 27, 2018

(54) SEMICONDUCTOR DEVICE

(71) Applicant: Kabushiki Kaisha Toshiba, Minato-ku, Tokyo (JP)

(72) Inventor: Wataru Saito, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/260,774

(22) Filed: Sep. 9, 2016

(65) Prior Publication Data
US 2017/0141224 A1    May 18, 2017

(30) Foreign Application Priority Data
Nov. 16, 2015 (JP) .................. 2015-223872

(51) Int. Cl.
| H01L 29/78 | (2006.01) |
| H01L 29/06 | (2006.01) |
| H01L 29/40 | (2006.01) |
| H01L 29/423 | (2006.01) |
| H01L 29/66 | (2006.01) |
| H01L 29/786 | (2006.01) |

(52) U.S. Cl.
CPC ...... *H01L 29/7827* (2013.01); *H01L 29/0634* (2013.01); *H01L 29/0649* (2013.01); *H01L 29/0684* (2013.01); *H01L 29/402* (2013.01); *H01L 29/4236* (2013.01); *H01L 29/66734* (2013.01); *H01L 29/7803* (2013.01); *H01L 29/7811* (2013.01); *H01L 29/7813* (2013.01); *H01L 29/7817* (2013.01); *H01L 29/7824* (2013.01); *H01L 29/7835* (2013.01); *H01L 29/78624* (2013.01); *H01L 29/0696* (2013.01)

(58) Field of Classification Search
CPC ............. H01L 29/7827; H01L 29/7824; H01L 29/78624
USPC ......................... 257/607, 329, 263
See application file for complete search history.

(56) References Cited

U.S. PATENT DOCUMENTS

| 5,216,275 A | 6/1993 | Chen |
| 7,238,576 B2 | 7/2007 | Yamaguchi et al. |
| 8,461,648 B2 | 6/2013 | Pfirsch et al. |
| 2003/0222327 A1 | 12/2003 | Yamaguchi et al. |
| 2013/0221426 A1 | 8/2013 | Saito et al. |

(Continued)

FOREIGN PATENT DOCUMENTS

JP    2005-142240 A    6/2005

*Primary Examiner* — Bo Fan
(74) *Attorney, Agent, or Firm* — White & Case LLP

(57) ABSTRACT

A semiconductor device comprising:
a first electrode; a first semiconductor region; a second semiconductor region; a third semiconductor region; a fourth semiconductor region; a fifth semiconductor region;
an insulating portion that is provided between the second semiconductor region and the fifth semiconductor region and between the third semiconductor region and the fifth semiconductor region;
a sixth semiconductor region; a seventh semiconductor region;
a gate electrode;
a gate insulating layer;
a second electrode; and
a third electrode that is provided on the third semiconductor region and electrically connected to the third semiconductor region and the gate electrode.

15 Claims, 31 Drawing Sheets

(56) References Cited

U.S. PATENT DOCUMENTS

| | | | |
|---|---|---|---|
| 2014/0097517 A1* | 4/2014 | Moens | H01L 29/36 257/607 |
| 2014/0264477 A1* | 9/2014 | Bhalla | H01L 29/0619 257/263 |
| 2015/0171174 A1* | 6/2015 | Georgescu | H01L 29/66666 257/329 |

* cited by examiner

SEMICONDUCTOR DEVICE

CROSS-REFERENCE TO RELATED APPLICATIONS

This application is based upon and claims the benefit of priority from Japanese Patent Application NO. 2015-223872 filed on Nov. 16, 2015, the entire contents of which are incorporated herein by reference.

FIELD

The embodiments of the present invention relate to a semiconductor device.

BACKGROUND

A semiconductor device such as a MOSFET (Metal Oxide Semiconductor Field Effect Transistor) is used for, for example, the purpose of power conversion. An ON-state resistance of the semiconductor device is desired to be low.

DETAILED DESCRIPTION

Figure 1:
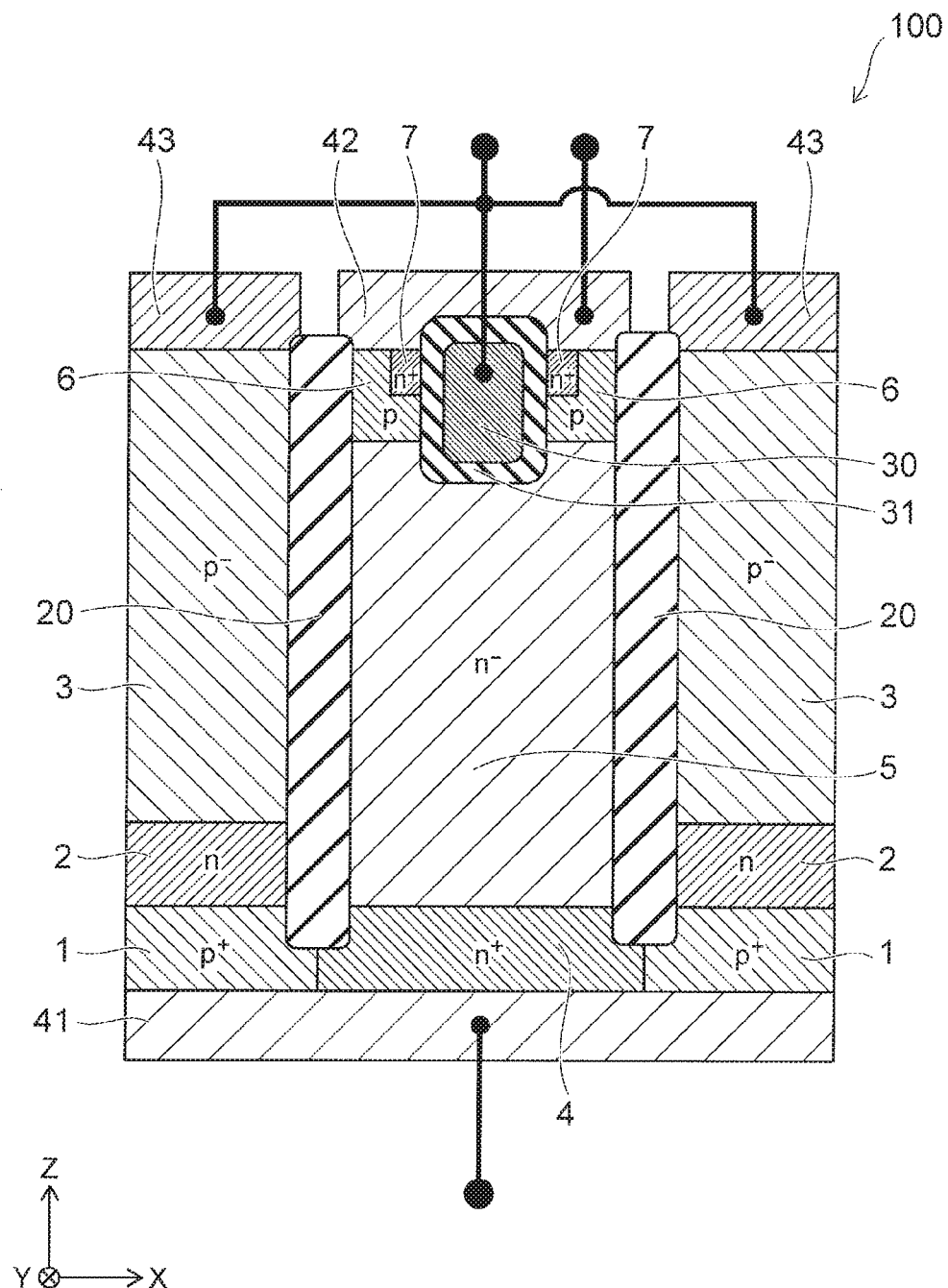
FIG. 1 is a cross-sectional view illustrating a part of a semiconductor device according to a first embodiment.

Hereinafter, embodiments of the invention will be described with reference to the drawings.

Further, the drawings are illustrated schematically or conceptually, and a relation between thicknesses and widths of the components and a ratio between sizes of the components are not necessarily limited to the same one realized in this disclosure. In addition, even in a case where the same portions are illustrated, the dimensions or the ratios of the portions may be differently illustrated from each other.

In addition, the same components as those described already will be denoted with the same symbols in the drawings in this specification, and the description thereof will be appropriately omitted.

In the description of the embodiments, an XYZ orthogonal coordinate system is used. A direction from a drain electrode 41 to a source electrode 42 is set as a Z direction (a first direction). Two directions which are perpendicular to the Z direction and orthogonal to each other are set as an X direction (a second direction) and a Y direction.

In the description below, the notations of $n^-$, $n$, $n^-$, $n^{--}$, and, $p^+$, $p$, and $p^-$ indicate a relative height of an impurity concentration in the respective conductivity types. In other words, the notation attached by "+" indicates that the impurity concentration is relatively higher than the notation having no notation attached, and the notation attached by "−" indicates that the impurity concentration lowers as its number increases. In addition, the notation attached by "−" indicates that the impurity concentration is lowered as the number of impurities, and strengthened as the number is increased.

In the embodiments described hereinafter, each embodiment may be carried out by replacing the p-type and the n-type with each other in each semiconductor region.

First Embodiment

FIG. 1 is a cross-sectional view illustrating a part of a semiconductor device 100 according to a first embodiment. The semiconductor device 100 is, for example, a vertical MOSFET.

As illustrated in FIG. 1, the semiconductor device 100 includes a $p^+$ type (for example, a first conductivity type) drain region 1 (a first semiconductor region), an n type (for example, a second conductivity type) buffer region 2 (a second semiconductor region), a $p^-$ type pillar region 3 (a third semiconductor region), an $n^+$ type drain region 4 (a fourth semiconductor region), an $n^-$ type pillar region 5 (a fifth semiconductor region), a p type base region 6 (a sixth semiconductor region), an $n^+$ type source region 7 (a seventh semiconductor region), an insulating portion 20, a gate electrode 30, a gate insulating layer 31, the drain electrode 41 (a first electrode), the source electrode 42 (a second electrode), and an electrode 43 (a third electrode).

The drain electrode 41 is provided in the rear surface of the semiconductor device 100.

The $p^+$ type drain region 1 is provided on a part of the drain electrode 41, and electrically connected to the drain electrode 41.

The n type buffer region 2 is provided on the $p^+$ type drain region 1.

The $p^-$ type pillar region 3 is provided on the n type buffer region 2.

The $n^+$ type drain region 4 is provided on another part of the drain electrode 41, and electrically connected to the drain electrode 41.

The $n^-$ type pillar region 5 is provided on the $n^+$ type drain region 4.

At least a part of the $n^-$ type pillar region 5 is aligned with at least a part of the $p^-$ type pillar region 3 in the X direction. That is, a part of the $n^-$ type pillar region 5 and a part of the $p^-$ type pillar region 3 are arranged in the X direction.

The p type base region 6 is provided on the $n^-$ type pillar region 5.

The $n^+$ type source region 7 is selectively provided on the p type base region 6.

The insulating portion 20 is provided between the n type buffer region 2 and the $n^-$ type pillar region 5, between the $p^-$ type pillar region 3 and the $n^-$ type pillar region 5, and between the $p^-$ type pillar region 3 and the p type base region 6.

The gate electrode 30 is aligned with the p type base region 6 in the X direction.

The gate insulating layer 31 is provided between the gate electrode 30 and each of the $n^-$ type pillar region 5, the p type base region 6, and the $n^+$ type source region 7. The thickness of the insulating portion 20 in the X direction is, for example, thicker than that of the gate insulating layer 31.

The $p^+$ type drain region 1, the n type buffer region 2, the $p^-$ type pillar region 3, the $n^+$ type drain region 4, the $n^-$ type pillar region 5, the p type base region 6, the $n^+$ type source region 7, the insulating portion 20, and the gate electrode 30 are, for example, provided at plural places in the X direction, and extended in the Y direction.

The $n^-$ type pillar region 5 and the $p^-$ type pillar region 3 are alternately provided in the X direction. The insulating portion 20 is provided between these semiconductor regions.

The source electrode 42 is provided in the surface of the semiconductor device 100, and positioned on the p type base region 6 and the $n^+$ type source region 7. The source electrode 42 is electrically connected to these semiconductor regions. In addition, the gate insulating layer 31 is provided between the source electrode 42 and the gate electrode 30, and these electrodes are electrically separated.

The electrode 43 is provided in the surface of the semiconductor device 100 to be separated from the source electrode 42, and positioned on the $p^-$ type pillar region 3. In addition, the electrode 43 is electrically connected to the $p^-$ type pillar region 3 and the gate electrode 30.

Here, the operation of the semiconductor device 100 will be described.

When a voltage equal to or more than a threshold value is applied to the gate electrode 30 in a state where a positive voltage with respect to the source electrode 42 is applied to the drain electrode 41, an inversion channel is formed in a region of the p type base region 6 in the vicinity of the gate insulating layer 31 and the MOSFET becomes an ON state.

At this time, the voltage is also applied to the p type pillar region 3 electrically connected to the gate electrode 30. Electrons are attracted to the region in the vicinity of the insulating portion 20 of the $n^-$ type pillar region 5 by the voltage applied to the $p^-$ type pillar region 3, and an accumulation channel of the electrons is formed.

Thereafter, when the voltage applied to the gate electrode 30 becomes less than the threshold value, the MOSFET is turned off, and the inversion channel and the accumulation channel disappear. When the MOSFET enters an OFF state, a depletion layer is spread by the voltage between the drain electrode 41 and the source electrode 42 from a pn junction surface between the $n^-$ type pillar region 5 and the p type base region 6 and a pn junction surface between the n type buffer region 2 and the $p^-$ type pillar region 3 in the vertical direction. In addition, the depletion layer is spread by the voltage between the drain electrode 41 and the gate electrode 30 from the boundary between the $p^-$ type pillar region 3 and the insulating portion 20 and the boundary between the $n^-$ type pillar region 5 and the insulating portion 20 in the horizontal direction. Since the $p^-$ type pillar region 3 and the $n^-$ type pillar region 5 are depleted, the withstand voltage in the OFF state is kept.

In addition, a diode configured by the $p^+$ type drain region 1 and the n type buffer region 2 and a diode configured by the n type buffer region 2 and the $p^-$ type pillar region 3 are connected to each other in a reverse direction between the drain electrode 41 and the electrode 43. Therefore, the current flowing between the drain electrode 41 and the electrode 43 is suppressed to a level of a leak current at the time when the voltage is inversely applied to the diode.

Here, an exemplary material of each component will be described.

The $p^+$ type drain region 1, the n type buffer region 2, the $p^-$ type pillar region 3, the $n^+$ type drain region 4, the $n^-$ type pillar region 5, the p type base region 6, and the $n^+$ type source region 7 include silicon, silicon carbide, gallium nitride, or gallium arsenide as a semiconductor material.

As an n type impurity added to the semiconductor material, arsenide, phosphorous, or antimony can be used. As a p type impurity, boron can be used.

The gate electrode 30 contains a conductive material such as polysilicon.

The insulating portion 20 and the gate insulating layer 31 contain an insulating material such as silicon oxide.

The drain electrode 41, the source electrode 42, and the electrode 43 contain a metal such as aluminum.

Next, an exemplary method of manufacturing the semiconductor device 100 according to the first embodiment will be described with reference to FIGS. 2 to 4.

Figure 3A:
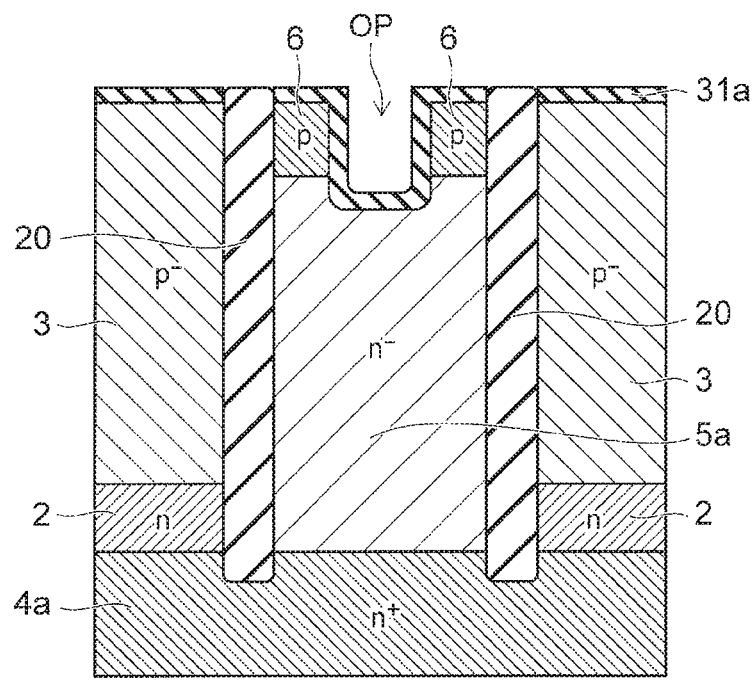
FIGS. 3A and 3B are cross-sectional views illustrating a manufacturing process of the semiconductor device according to the first embodiment.
Figure 3B:
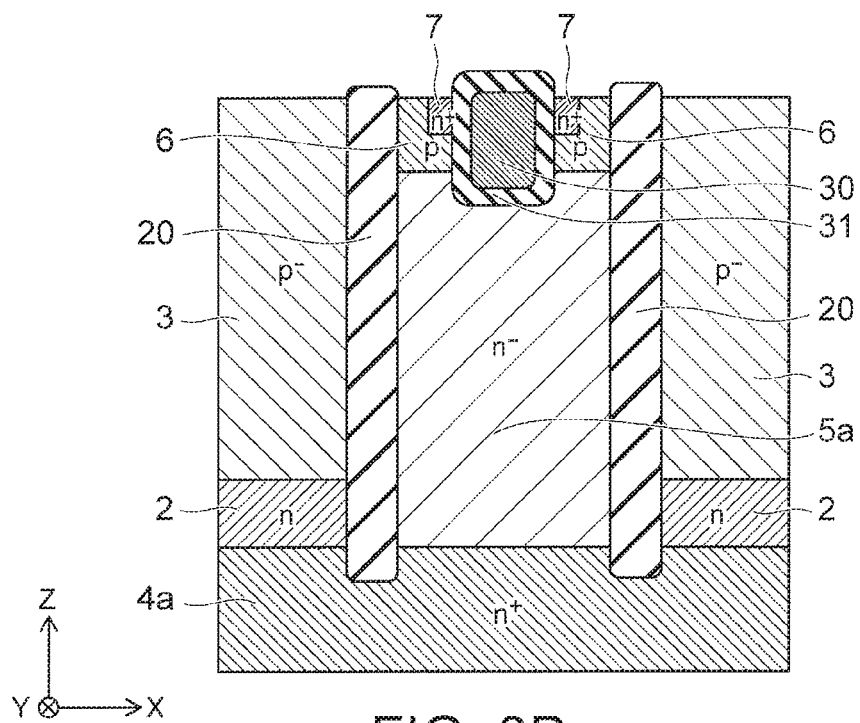
Figure 4A:
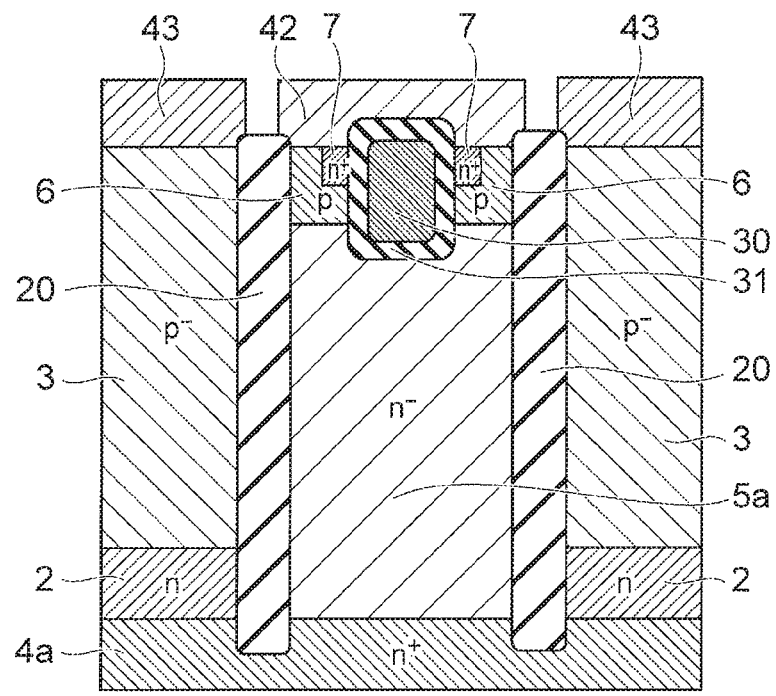
FIGS. 4A and 4B are cross-sectional views illustrating a manufacturing process of the semiconductor device according to the first embodiment.
Figure 4B:
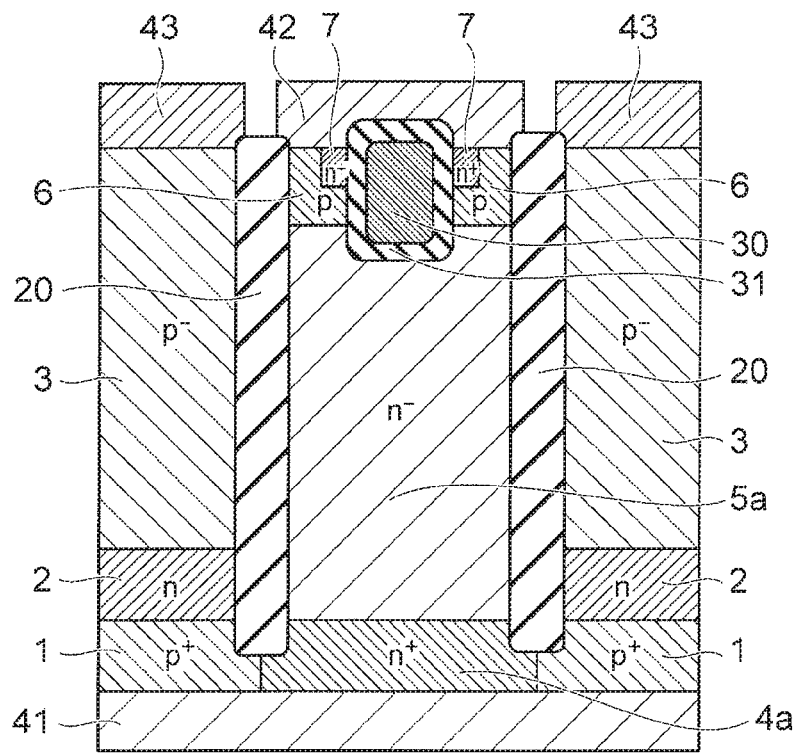

FIGS. 2 to 4 are cross-sectional views illustrating a manufacturing process of the semiconductor device 100 according to the first embodiment.

Figure 2A:
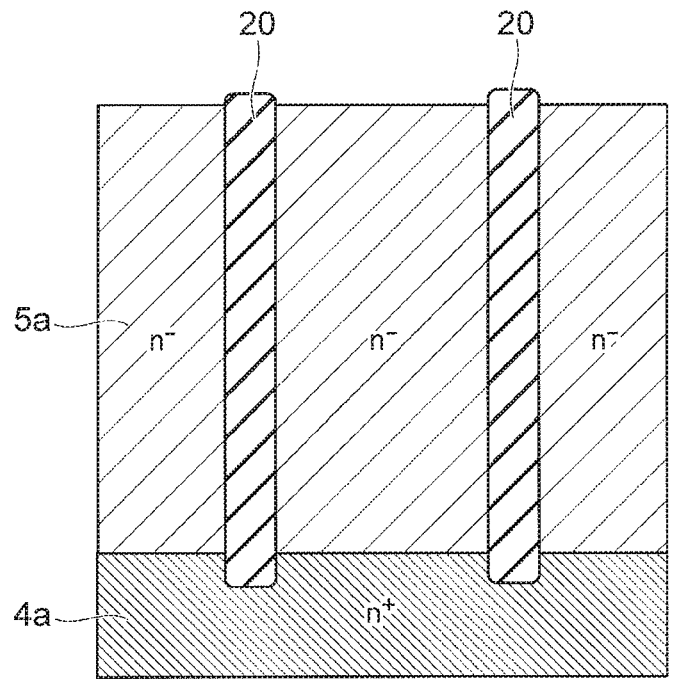
FIGS. 2A and 2B are cross-sectional views illustrating a manufacturing process of the semiconductor device according to the first embodiment.

First, a semiconductor substrate is prepared in which an $n^-$ type semiconductor layer 5a is provided on an $n^+$ type semiconductor layer 4a. Next, a plurality of openings are formed to pass through the $n^-$ type semiconductor layer 5a and reach the $n^+$ type semiconductor layer 4a. Subsequently, as illustrated in FIG. 2A, these openings are filled with an insulating material to form the insulating portion 20.

Figure 2B:
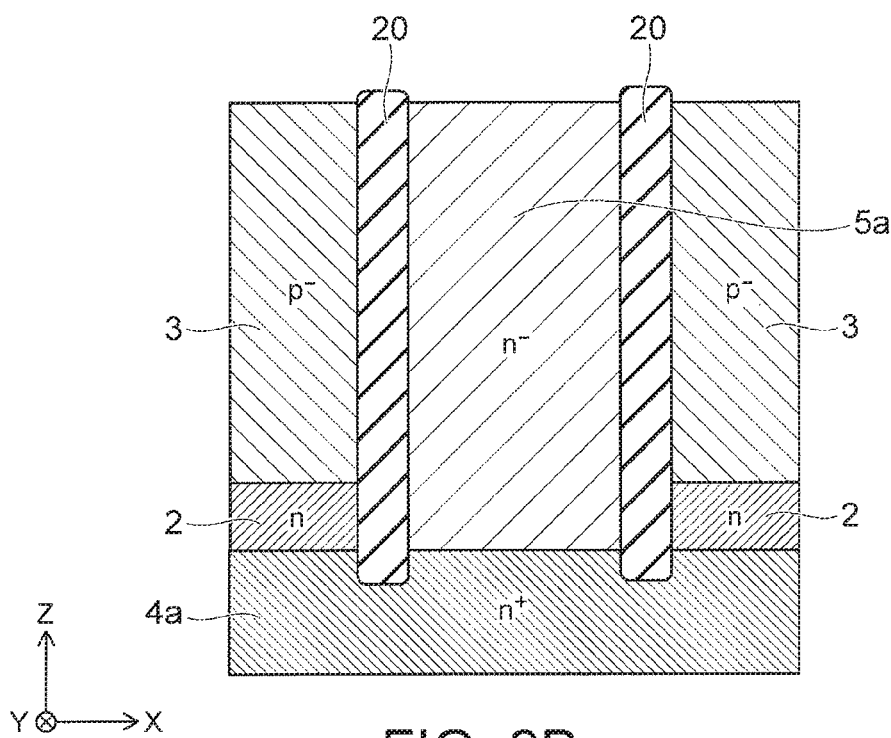

Next, a part of the $n^-$ type semiconductor layer 5a positioned between the insulating portions 20 is removed to form an opening. The n type impurity is implanted in the bottom of the opening to form an n type buffer region 2. Subsequently, a p type semiconductor layer is epitaxially grown on the n type buffer region 2 to fill the opening. Through this process, the $p^-$ type pillar region 3 is formed as illustrated in FIG. 2B.

Next, the p type impurity is implanted in the surface of the remaining $n^-$ type semiconductor layer 5a to form a p type base region 6. Subsequently, an opening OP is formed to pass through the p type base region 6 and reach the n type semiconductor layer 5a. Subsequently, the inner wall of the opening OP, the surface of the $p^-$ type pillar region 3, and the surface of the p type base region 6 are subjected to thermal oxidation to form an insulating layer 31a as illustrated in FIG. 3A.

Next, a conductive layer is formed to fill the opening OP on the insulating layer 31a. The conductive layer is etched back to make the surface retreat so as to form the gate electrode 30 in the opening OP. Subsequently, the surface of the p type base region 6 is ion-implanted with the n type impurity through the first insulating layer 31a to form the $n^+$ type source region 7. Subsequently, a second insulating layer is formed to cover the gate electrode 30. The first insulating layer 31a and the second insulating layer are patterned to expose the surfaces of the $p^-$ type pillar region 3, the p type base region 6, and the $n^+$ type source region 7. The structure at this state is illustrated in FIG. 3B.

Next, a metal layer is formed to cover the $p^-$ type pillar region 3, the p type base region 6, and the $n^+$ type source region 7. The metal layer is patterned to form the source electrode 42 and the electrode 43. Subsequently, as illustrated in FIG. 4A, the rear surface of the $n^+$ type semiconductor layer 4a is polished until the thickness of the $n^+$ type semiconductor layer 4a becomes a predetermined thickness.

Next, the portion of the $n^+$ type semiconductor layer 4a below the n type buffer region 2 is ion-implanted with the p type impurity to form the $p^+$ type drain region 1. Thereafter, a metal layer is formed below the $p^+$ type drain region 1 and the $n^+$ type semiconductor layer 4a, and the drain electrode 41 is formed to make the semiconductor device 100.

Here, the operation and the effect of this embodiment will be described with reference to FIG. 5.

Figure 5:
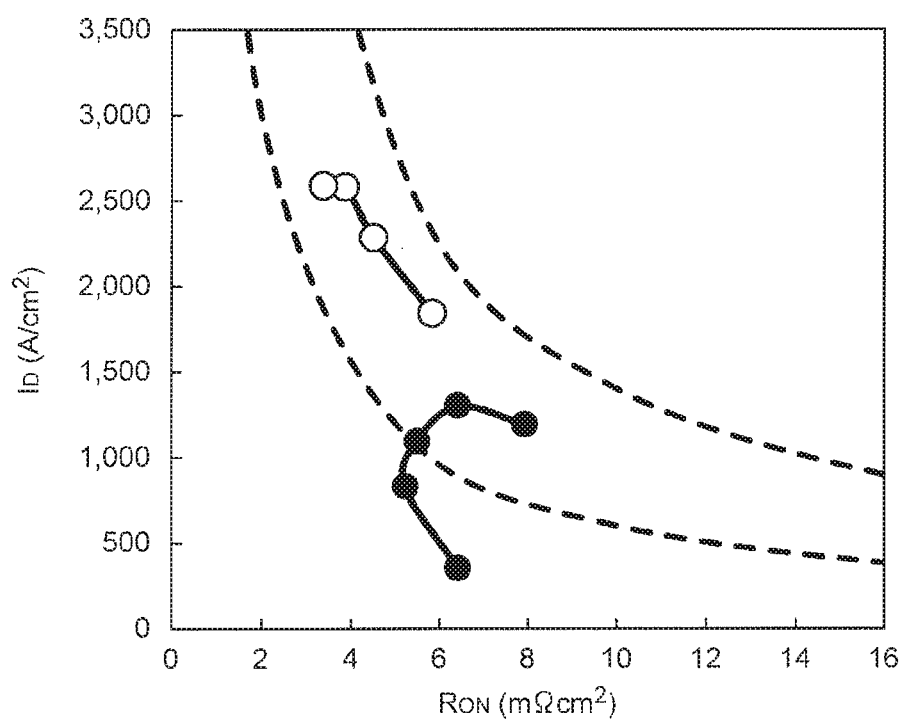
FIG. 5 is a graph illustrating a relation between an ON-state resistance and a saturated drain current density of the semiconductor device.

FIG. 5 is a graph illustrating a relation between an ON-state resistance of the semiconductor device and a saturated drain current density.

In FIG. 5, the horizontal axis indicates an ON-state resistance RON, and the vertical axis indicates a saturated drain current density ID. In addition, the black circles indicate the characteristics of the semiconductor device according to a conventional technology, and the white circles indicate the characteristics of the semiconductor device according to this embodiment. The region surrounded by the broken lines indicates a product trend. In other words, the product trend is an increase of the saturated drain current density as the ON-state resistance is decreased.

In FIG. 5, the characteristics of the semiconductor device of a superjunction structure (hereinafter, referred to as SJ structure) in which an n type pillar region and a p type pillar region abut on each other and are alternately disposed are described as the characteristics of the semiconductor device according to the conventional technology. In the semiconductor device according to the conventional technology, the amount of the n type impurities contained in the n type pillar and the amount of the p type impurities contained in the p type pillar are set to be equal, the width of each pillar region is made to be narrow, and the impurity concentration of each pillar region is increased, so that the ON-state resistance can be reduced while the withstand voltage of the semiconductor device is prevented from being lowered. However, in a case where the impurity concentration of each pillar region is high, and once a variation in the impurity concentration occurs in each region, the amount of the impurities become to vary significantly, thereby causing a significant reduction in the withstand voltage. Therefore, in a case where a margin with respect to the variation in the impurity concentration is considered, it is difficult to increase the impurity concentration in proportion to the reduction in the width of each pillar.

When the width of the n type pillar region is made narrow while securing the margin with respect to the variation in the impurity concentration, a ratio of the width of the depleted region to the entire width of the n type pillar region becomes large in the ON state. Therefore, as illustrated in FIG. 5, the ON-state resistance can be decreased, but the saturated drain current density is not increased. In addition, when the width of the n type pillar region is made narrow further, the ratio of the depleted region is further increased. Therefore, the saturated drain current density is decreased and, at the same time, the current passage is constricted to cause an increase in the ON-state resistance.

On the contrary, in the semiconductor device 100 according to this embodiment, the $p^-$ type pillar region 3 is provided and the electrode 43 is provided on the $p^-$ type pillar region 3, and the electrode 43 is electrically connected to the gate electrode 30. According to such a configuration, as described above, when the voltage is applied to the gate electrode 30, the voltage is also applied to the $p^-$ type pillar region 3, and the accumulation channel of the electrons is formed in the region in the vicinity of the insulating portion 20 of the $n^-$ type pillar region 5. Since the accumulation channel is formed, the depletion layer is hardly spread from the boundary between the insulating portion 20 and the $n^-$ type pillar region 5 toward the $n^-$ type pillar region 5. Therefore, even in a case where the width of the $p^-$ type pillar region 3 (the length in the X direction) and the width of the $n^-$ type pillar region 5 are short, and in a case where the impurity concentration of each semiconductor region is increased, the depleting of the $n^-$ type pillar region 5 can be suppressed in the ON state. In addition, since the depletion layer is spread from the boundary between the insulating portion 20 and the n⁻ type pillar region 5 toward the n⁻ type pillar region 5 in the OFF state, the withstand voltage of the semiconductor device is secured.

Furthermore, in the semiconductor device of the conventional SJ structure, the p type pillar region is electrically connected to the source electrode, and the n type pillar region is electrically connected to the drain electrode. In this case, the junction capacitance between the n type pillar region and the p type pillar region becomes a drain-source capacitance. Therefore, in the semiconductor device according to the conventional technology, the drain-source capacitance is significantly large compared to a gate-drain capacitance, and a voltage change rate (dV/dt) of the drain at the time of switching is not easy to be adjusted using an external gate resistor. Therefore, it is difficult to suppress switching noises.

On the contrary, in the semiconductor device 100 according to this embodiment, the p⁻ type pillar region 3 is electrically connected to the gate electrode 30. According to this configuration, the gate-drain capacitance become large compared to the semiconductor device according to the related art. Therefore, the controllability of the voltage change rate of the drain at the time of switching using the external gate resistor can be improved, and the switching noises can be easily suppressed.

According to this embodiment, a semiconductor device which can reduce an ON-state resistance is provided.

According to this embodiment, the ON-state resistance and the switching noises can be reduced while suppressing the reduction in the withstand voltage of the semiconductor device and the reduction in the saturated drain current density.

In addition, the semiconductor device 100 includes a parasitic p type MOSFET which is configured by the p⁺ type drain region 1, the n type buffer region 2, the p⁻ type pillar region 3, the insulating portion 20, and the n⁻ type pillar region 5. In a case where the positive voltage with respect to the drain electrode 41 is applied to the electrode 43, the inversion channel is formed in the region in the vicinity of the insulating portion 20 of the n type buffer region 2, and the parasitic p type MOSFET may be operated.

Here, when an n type impurity concentration of the n type buffer region 2 is increased to be equal to or more than, for example, an n type impurity concentration of the n⁻ type pillar region 5, a p type channel is hardly formed in the n type buffer region 2. Therefore, the possibility of the operation of the parasitic p type MOSFET is reduced, and the operation of the semiconductor device 100 can be made stable.

(First Modification)

Figure 6:
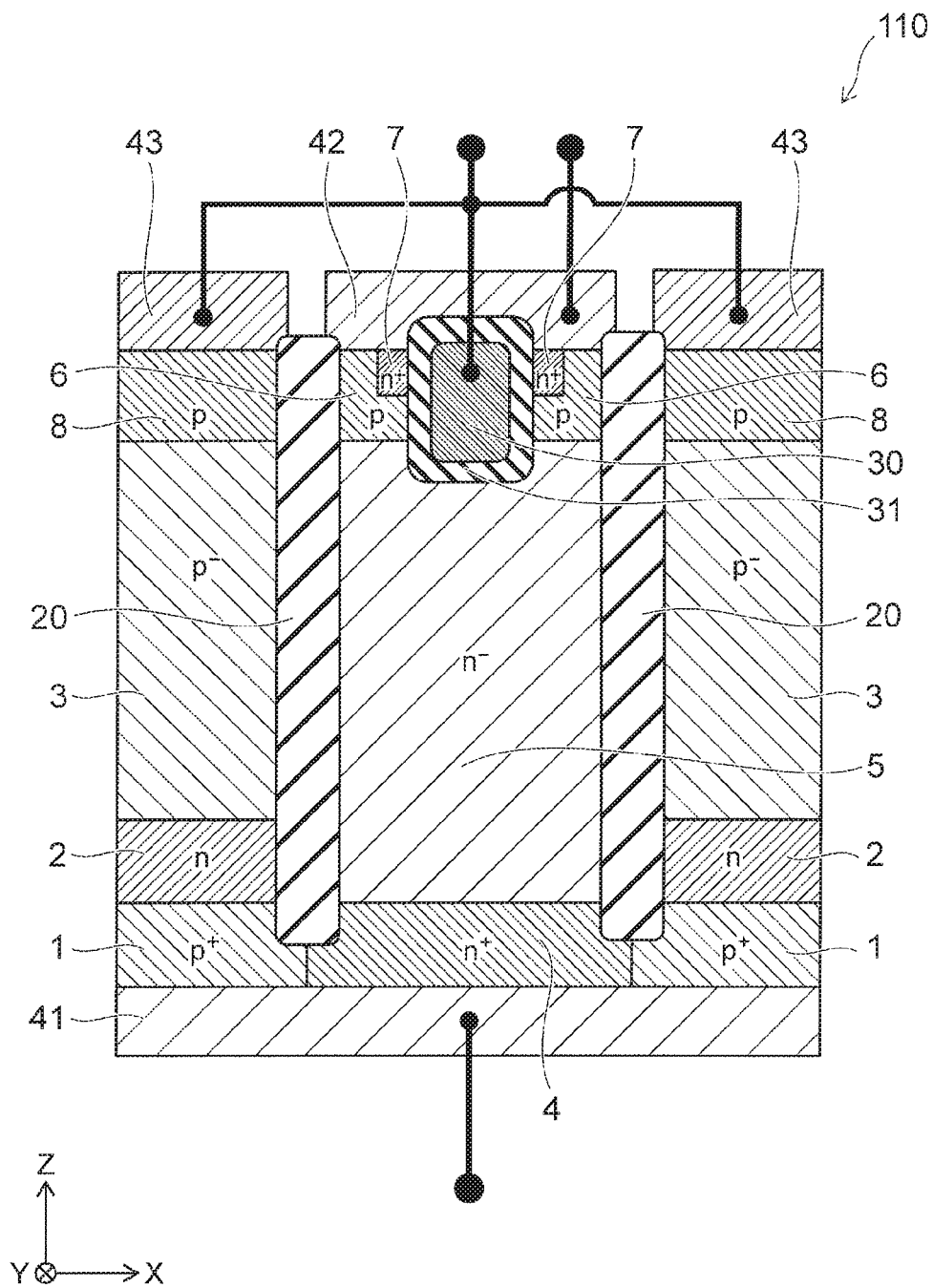
FIG. 6 is a cross-sectional view illustrating a part of a semiconductor device according to a first modification of the first embodiment.

FIG. 6 is a cross-sectional view illustrating a part of a semiconductor device 110 according to a first modification of the first embodiment.

The semiconductor device 110 is different from the semiconductor device 100 in that a p type semiconductor region 8 is further provided.

The p type semiconductor region 8 is provided on the p⁻ type pillar region 3, and disposed in parallel with the p type base region 6 in the X direction. In addition, the insulating portion 20 is provided between the p type semiconductor region 8 and the p type base region 6. The p⁻ type pillar region 3 is connected to the electrode 43 through the p type semiconductor region 8.

A p type impurity concentration of the p type semiconductor region 8 is higher than that in the p⁻ type pillar region 3. Therefore, the p⁻ type pillar region 3 and the electrode 43 can be electrically connected more reliably by making the p type semiconductor region 8 contacts with the electrode 43, compared to a case where the p⁻ type pillar region 3 contacts with the electrode 43.

(Second Modification)

Figure 7:
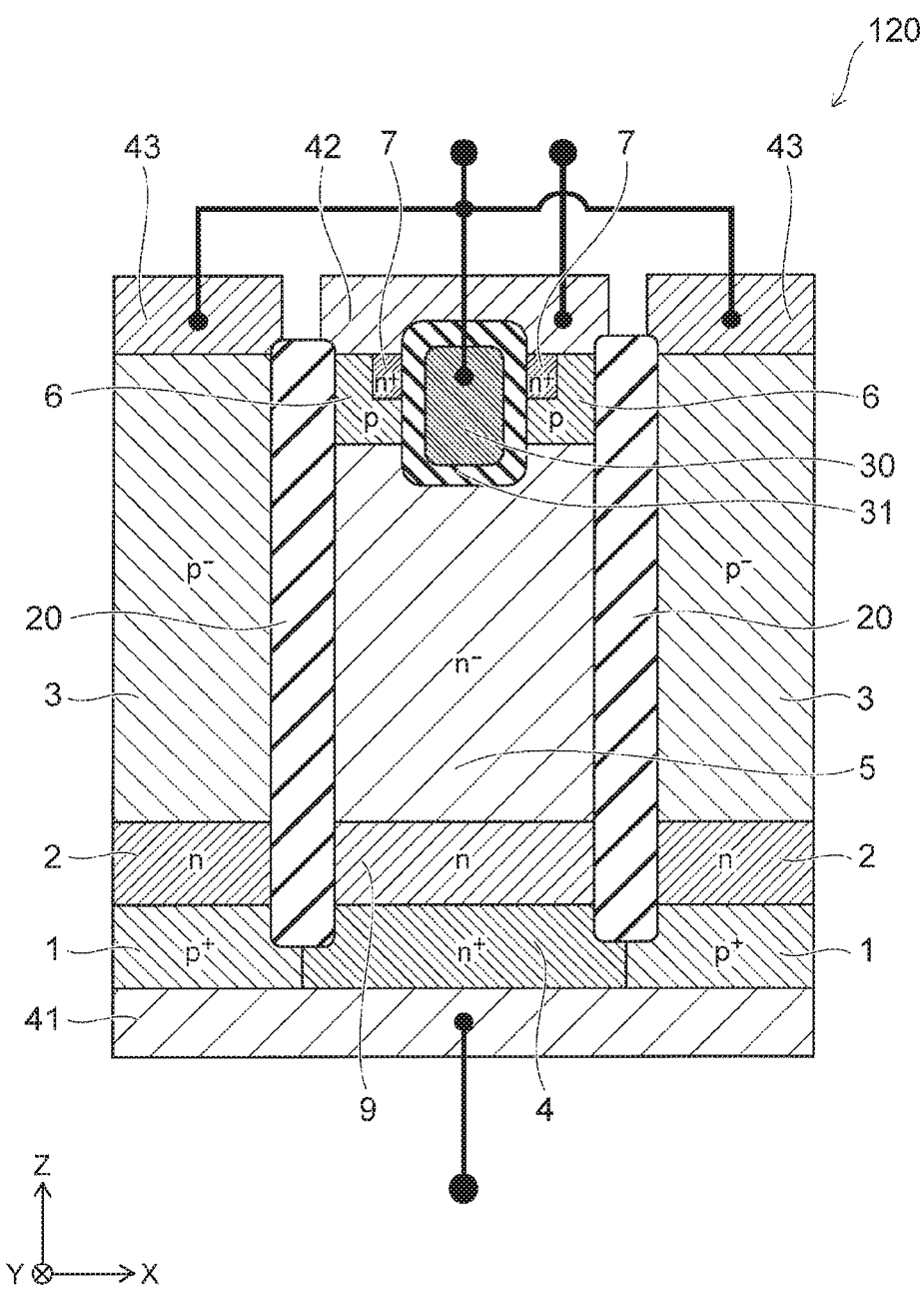
FIG. 7 is a cross-sectional view illustrating a part of a semiconductor device according to a second modification of the first embodiment.

FIG. 7 is a cross-sectional view illustrating a part of a semiconductor device 120 according to a second modification of the first embodiment. The semiconductor device 120 is different from the semiconductor device 100 in that an n type semiconductor region 9 is further provided.

The n type semiconductor region 9 is provided between the n⁺ type drain region 4 and the n⁻ type pillar region 5. In addition, the n type semiconductor region 9 is aligned with the n type buffer region 2 in the X direction.

Even in this modification, similarly to the semiconductor device 100, the ON-state resistance and the switching noises can be reduced while suppressing the reduction in the withstand voltage of the semiconductor device and the reduction in the saturated drain current density.

(Third Modification)

Figure 8:
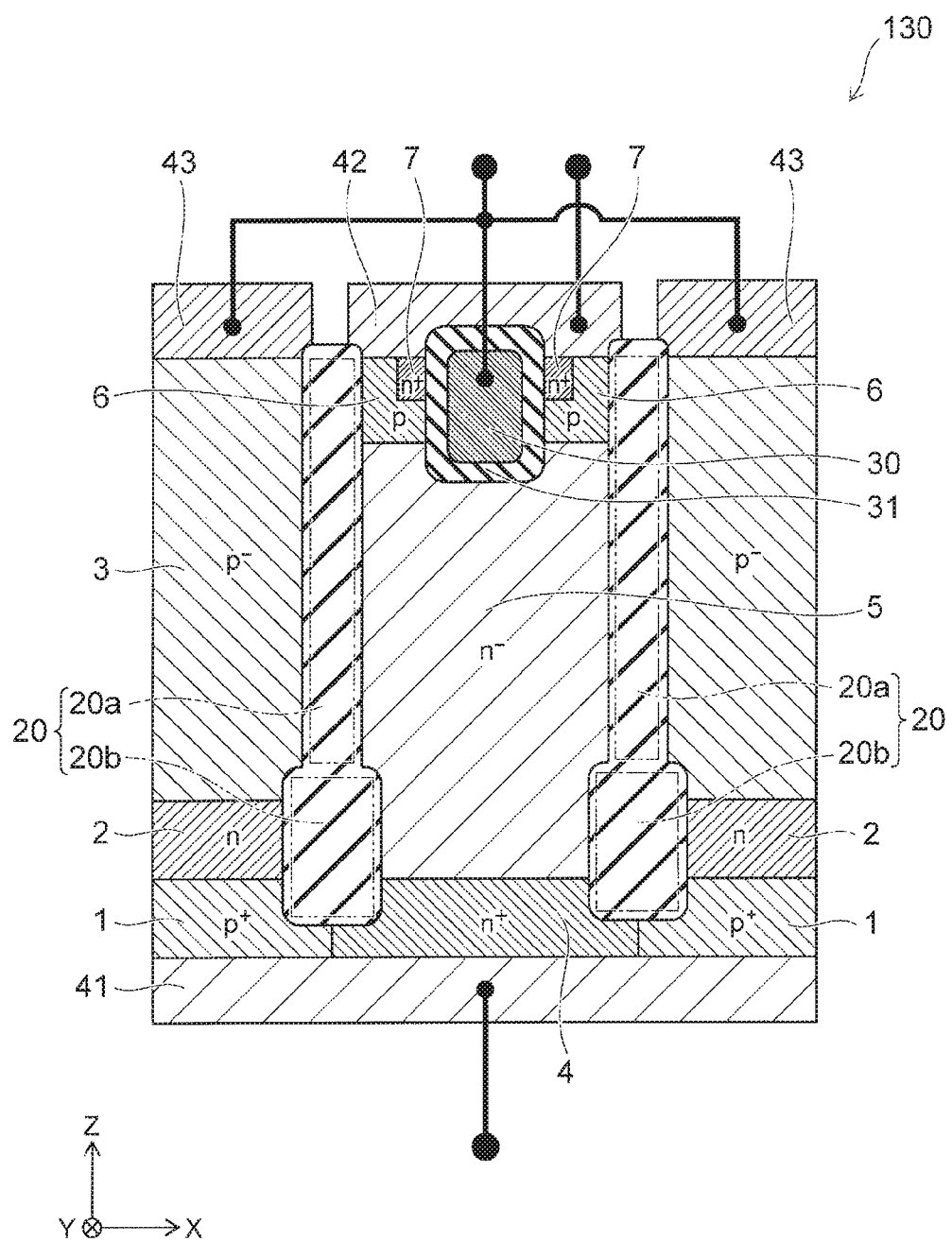
FIG. 8 is a cross-sectional view illustrating a part of a semiconductor device according to a third modification of the first embodiment.

FIG. 8 is a cross-sectional view illustrating a part of a semiconductor device 130 according to a third modification of the first embodiment.

The semiconductor device 130 is different in structure of the insulating portion 20 compared to the semiconductor device 100.

As illustrated in FIG. 8, the insulating portion 20 includes a first insulating portion 20a and a second insulating portion 20b. The first insulating portion 20a is aligned with the p⁻ type pillar region 3 in the X direction. The second insulating portion 20b is aligned with the n type buffer region 2 in the X direction. The thickness of the second insulating portion 20b in the X direction is thicker than that of the first insulating portion 20a in the X direction.

Here, a relation between the thickness of the insulating portion 20 in the X direction, the ON-state resistance, and the saturated drain current density will be described using FIG. 9.

Figure 9:
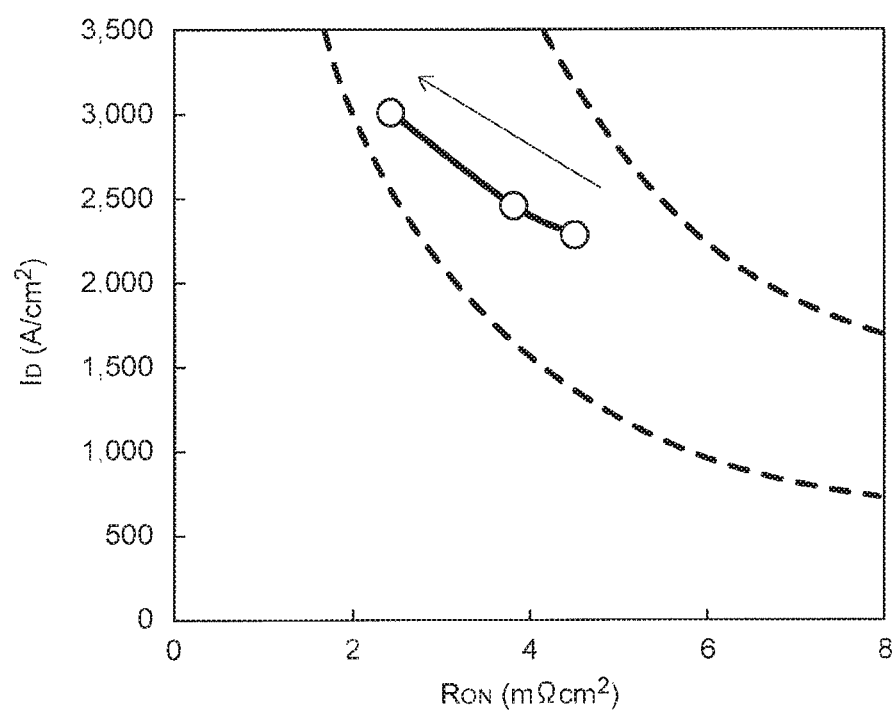
FIG. 9 is a graph illustrating a relation between the ON-state resistance and the saturated drain current density of the semiconductor device.

FIG. 9 is a graph illustrating a relation between the ON-state resistance of the semiconductor device and the saturated drain current density.

In FIG. 9, the horizontal axis indicates the ON-state resistance RON, and the vertical axis indicates the saturated drain current density ID. The region surrounded by the broken lines indicates the product trend similarly to FIG. 5. In addition, the graph shows that the thickness of the insulating portion 20 is thinned as it goes in a direction of arrow. Further, FIG. 9 shows the characteristics in a case where the thickness of the insulating portion 20 is constant in the Z direction.

As illustrated in FIG. 9, it can be seen that the ON-state resistance is decreased as the thickness of the insulating portion 20 is thinned and the saturated drain current density is increased. This is because the width of the storage channel formed in the n⁻ type pillar region 5 becomes wide by making the insulating portion 20 thin. On the other hand, when the thickness of the insulating portion 20 is thinned, in a case where the positive voltage with respect to the drain electrode 41 is applied to the electrode 43, the inverse channel is easily formed in the n type buffer region 2, and the possibility of the operation of the parasitic p type MOSFET is increased.

With this regard, in this modification, the thickness of the second insulating portion 20b is made thicker than that of the first insulating portion 20a. With such a configuration, the inversion channel is hardly formed in the n type buffer region 2.

In other words, according to this modification, the thickness of the first insulating portion 20a relatively thin, so that the ON-state resistance is decreased, and the saturated drain current density is increased. And the thickness of the second insulating portion 20b is relatively thick, so that the possibility of the operation of the parasitic p type MOSFET can be reduced.

(Fourth Modification)

A fourth modification of the first embodiment will be described with reference to FIGS. 10 to 12.

Figure 10:
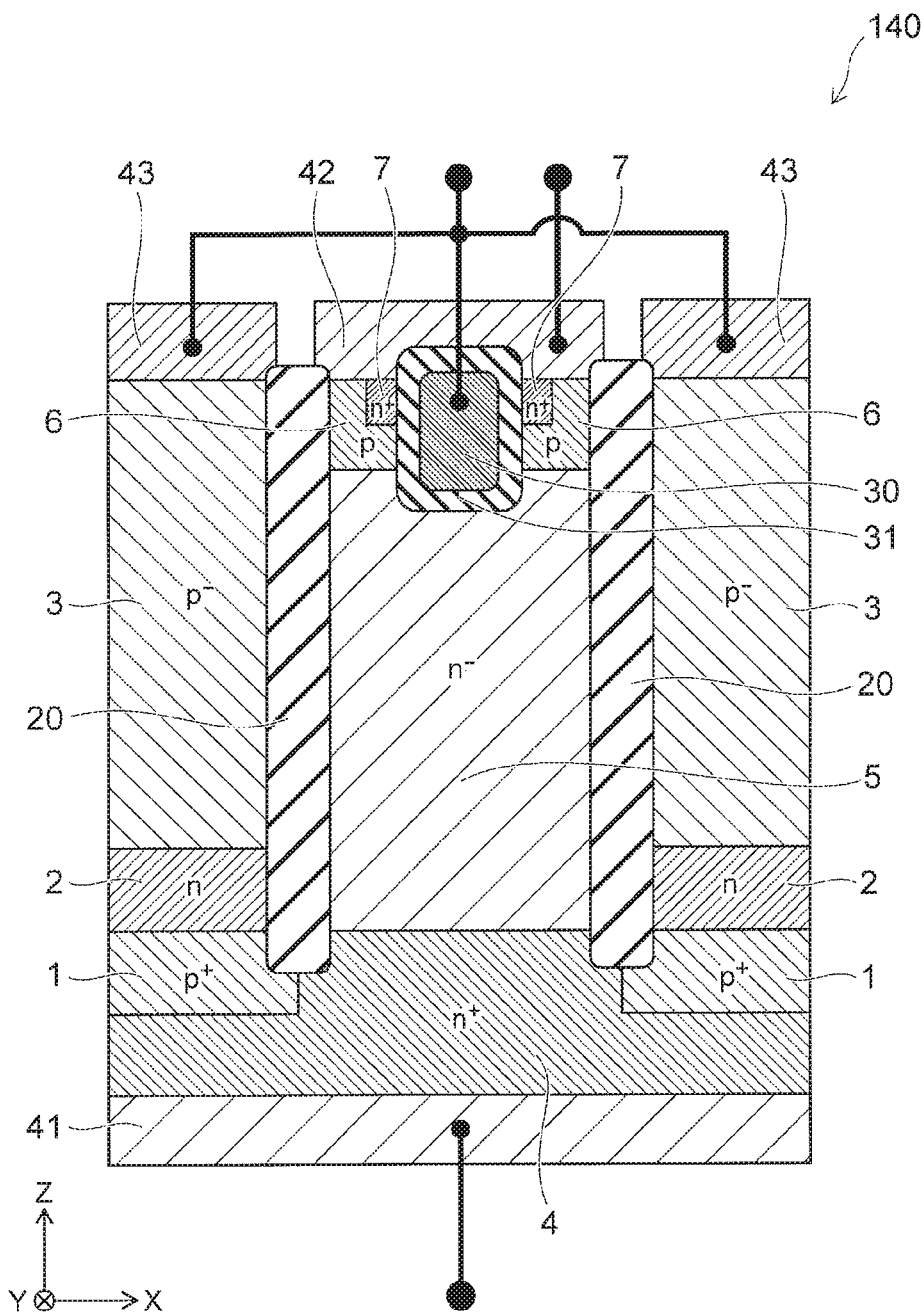
FIG. 10 is a cross-sectional view illustrating a part of a semiconductor device according to an example of a fourth modification of the first embodiment.

FIG. 10 is a cross-sectional view illustrating a part of a semiconductor device 140 according to the fourth modification of the first embodiment.

Figure 11:
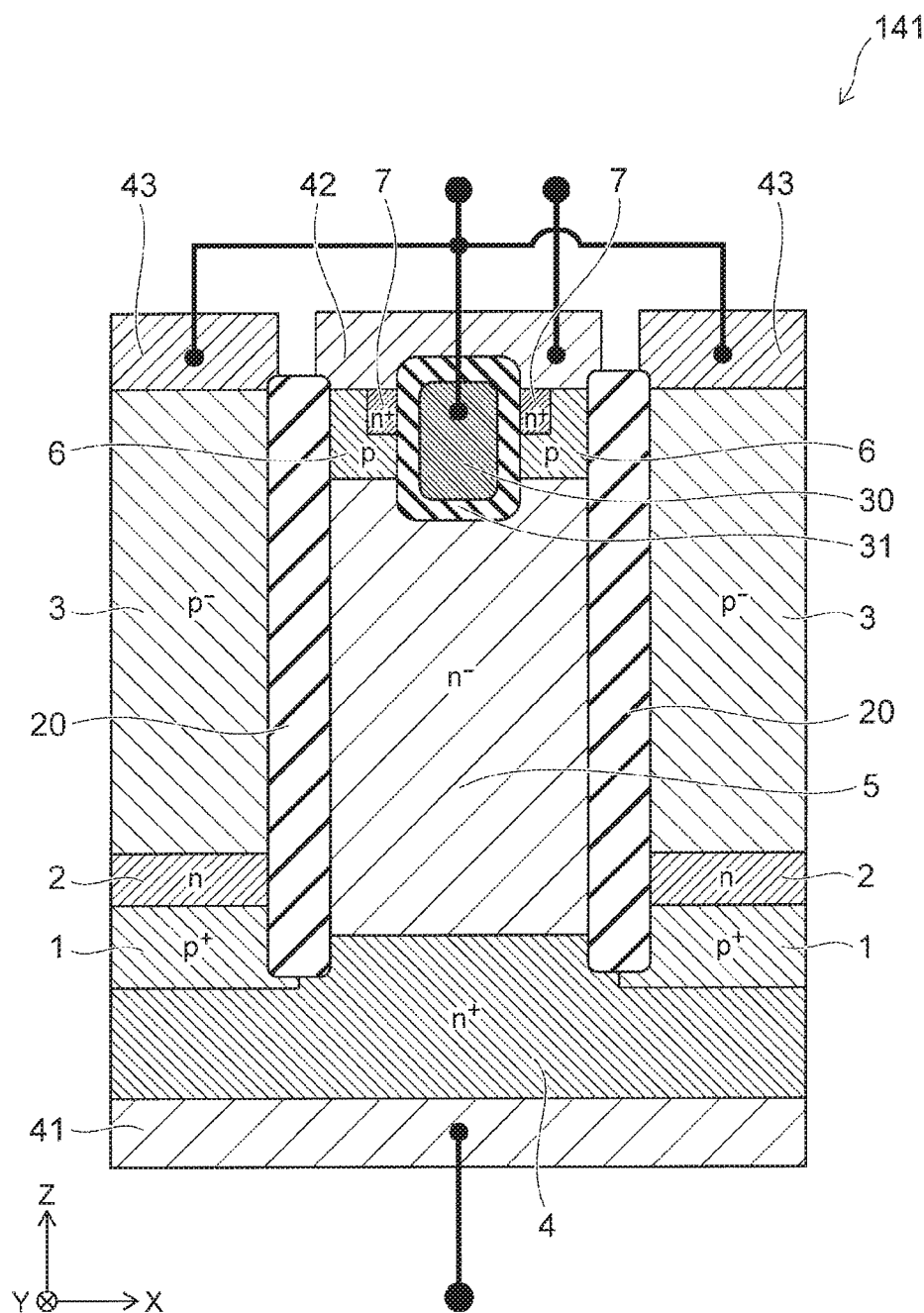
FIG. 11 is a cross-sectional view illustrating a part of a semiconductor device according to another example of the fourth modification of the first embodiment.

FIG. 11 is a cross-sectional view illustrating a part of a semiconductor device 141 according to another example of the fourth modification of the first embodiment.

Figure 12:
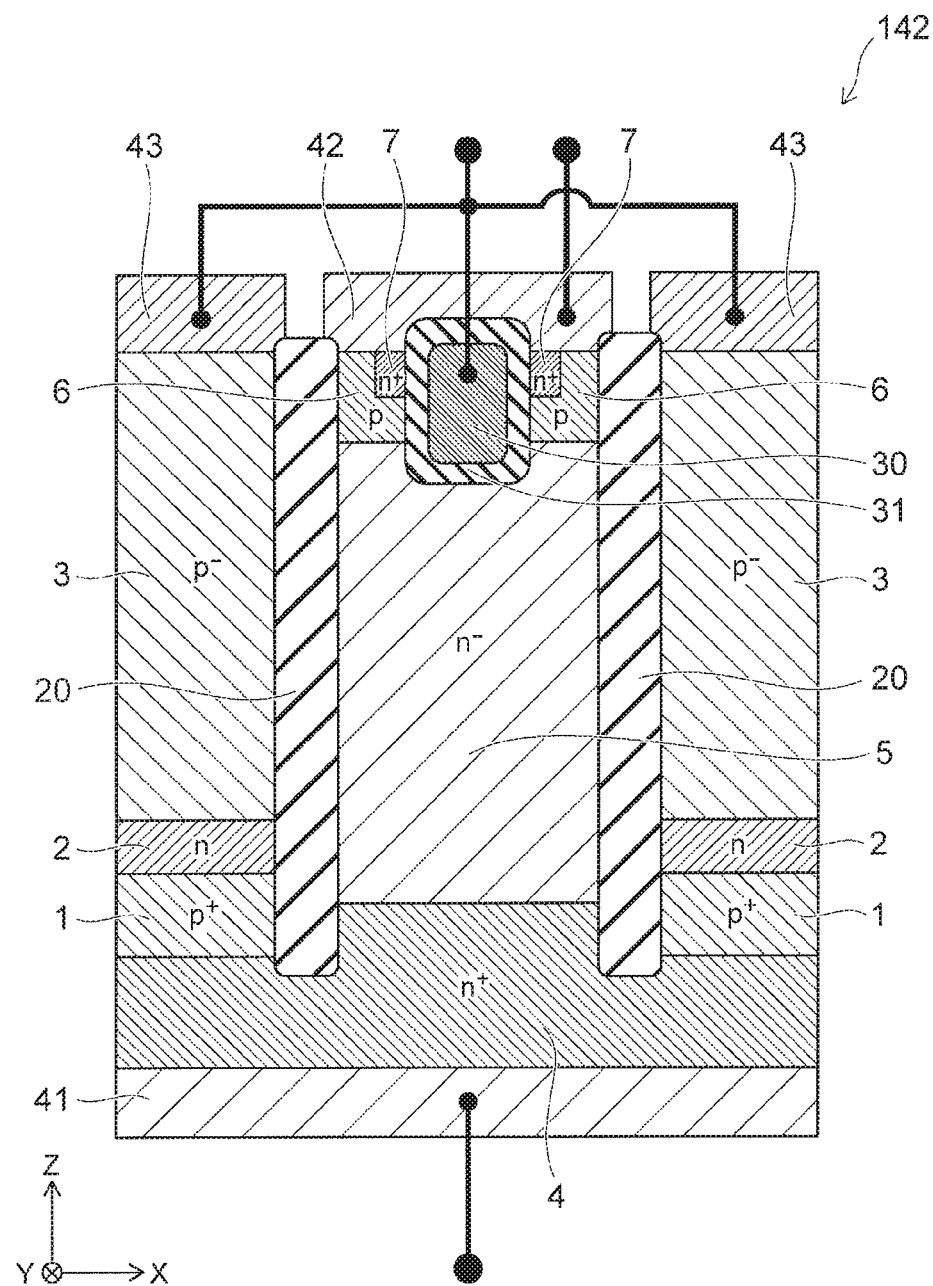
FIG. 12 is a cross-sectional view illustrating a part of a semiconductor device according to another example of the fourth modification of the first embodiment.

FIG. 12 is a cross-sectional view illustrating a part of a semiconductor device 142 according to another example of the fourth embodiment of the first embodiment.

In the semiconductor device 140, a part of the $n^+$ type drain region 4 is provided between the $p^+$ type drain region 1 and the drain electrode 41.

The semiconductor device of such a configuration is manufactured, for example, by the following method.

First, an $n^+$ type semiconductor layer is prepared, and the surface thereof is selectively ion-implanted with the p type impurity to form the $p^+$ type drain region 1. Next, an $n^-$ type semiconductor layer is formed on the $n^+$ type semiconductor layer to cover the $p^+$ type drain region 1. Thereafter, the same processes illustrated in FIGS. 2A to 4A are performed, and finally the drain electrode is formed in the rear surface of the $n^+$ type semiconductor layer.

According to this method, there is no need to form the $p^+$ type drain region 1 after the rear surface of the $n^+$ type semiconductor layer is polished. In addition, it is also possible to reduce a variation in position of the $p^+$ type drain region 1 in the Z direction caused by the variation in polishing amount of the $n^+$ type semiconductor layer.

In other words, according to this modification, there is provided a semiconductor device which is easily manufactured compared to the semiconductor device 100, and has a small variation in characteristics.

Here, as illustrated in FIG. 11, the upper end of the $p^+$ type drain region 1 may be positioned on a side near the source electrode 42 (in the Z direction) from the upper surface of the $n^+$ type drain region 4.

In addition, as illustrated in FIG. 12, the insulating portion 20 may be extended in the –Z direction, the lower end of the insulating portion 20 may be positioned on a side near the drain electrode 41 (in the –Z direction) from the lower surface of the $p^+$ type drain region 1.

Second Embodiment

Figure 13:
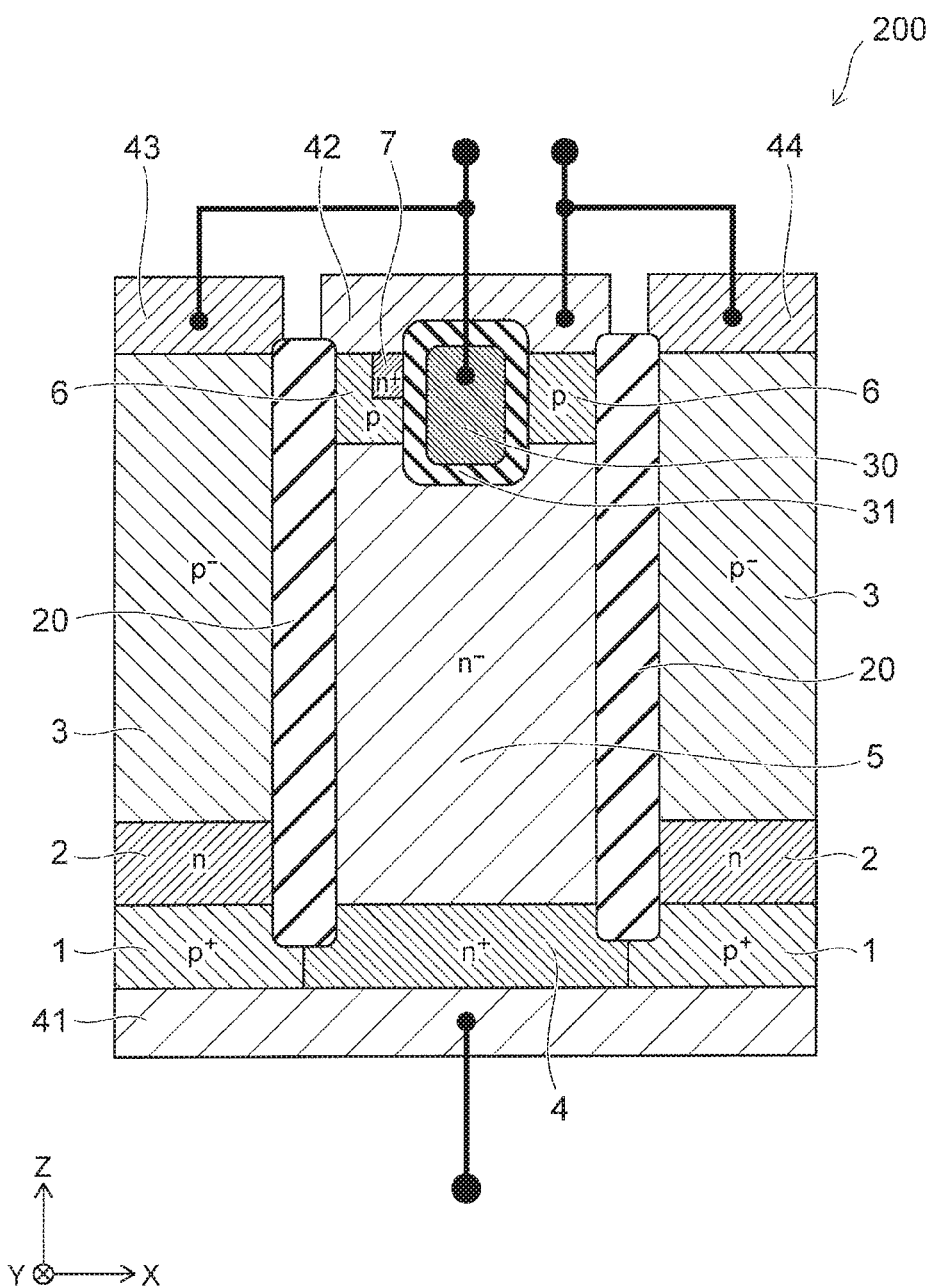
FIG. 13 is a cross-sectional view illustrating a part of a semiconductor device according to a second embodiment.

FIG. 13 is a cross-sectional view illustrating a part of a semiconductor device 200 according to a second embodiment.

In the semiconductor device 200, the $n^+$ type source region 7 is not provided on a part of a plurality of p type base regions 6. In addition, an electrode 44 electrically connected to the source electrode 42 is provided on a part of a plurality of $p^-$ type pillar regions 3. Thus, the $p^-$ type pillar region 3 is electrically connected to the source electrode 42 through the electrode 44.

When the gate-drain capacitance is made large, controllability of a switching speed can be improved, but the switching loss is increased. In the semiconductor device 200, since a part of the plurality of $p^-$ type pillar regions 3 is electrically connected to the source electrode 42, the gate-drain capacitance is small, and the drain-source capacitance is large compared to the semiconductor device 100. Therefore, according to this embodiment, the switching loss can be reduced compared to the semiconductor device 100.

Further, a ratio between the number of $p^-$ type pillar regions 3 electrically connected to the gate electrode 30 and the number of $p^-$ type pillar regions 3 electrically connected to the source electrode 42 is arbitrary, and may be appropriately changed.

(First Modification)

Figure 14:
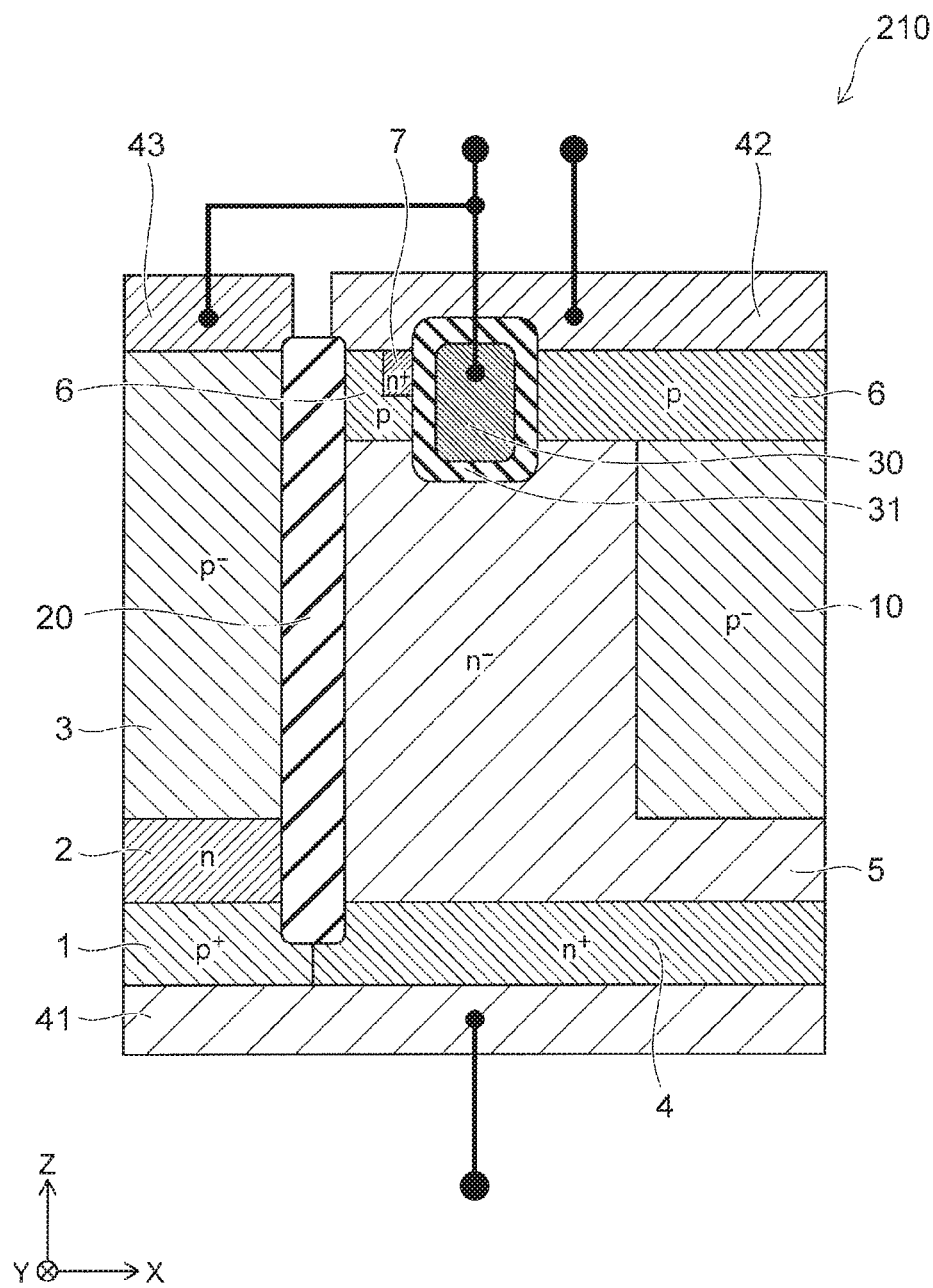
FIG. 14 is a cross-sectional view illustrating a part of a semiconductor device according to a first modification of the second embodiment.

FIG. 14 is a cross-sectional view illustrating a part of a semiconductor device 210 according to a first modification of the second embodiment.

The semiconductor device 210 is different from the semiconductor device 200 in that a $p^-$ type semiconductor region 10 is provided instead of the plurality of $p^-$ type pillar regions 3.

The $p^-$ type semiconductor region 10 is provided on a part of the $n^-$ type pillar region 5. The p type base region 6 and the source electrode 42 are extended in the X direction, and positioned on the $p^-$ type semiconductor region 10. The gate electrode 30 is provided on another part of the $n^-$ type pillar region 5, and is not aligned with the p type semiconductor region 10 in the Z direction. In addition, while the insulating portion 20 is provided between the $p^-$ type pillar region 3 and the $n^-$ type pillar region 5, the insulating portion 20 is not provided between the $n^-$ type pillar region 5 and the $p^-$ type semiconductor region 10.

Even in this modification, similarly to the semiconductor device 200, the gate-drain capacitance can be made small compared to the semiconductor device 100, so that the switching loss can be reduced.

Third Embodiment

Figure 15:
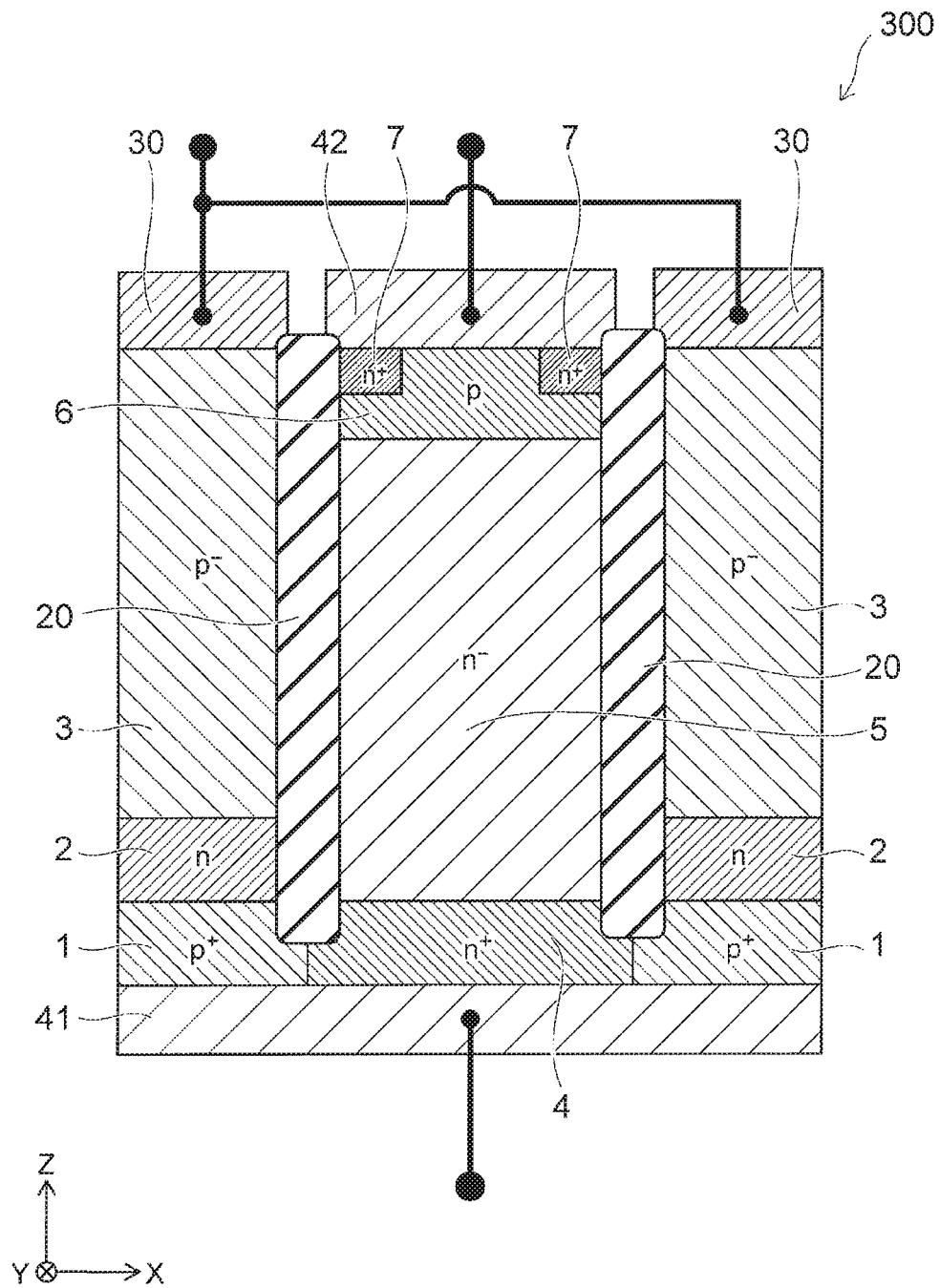
FIG. 15 is a cross-sectional view illustrating a part of a semiconductor device according to a third modification of the second embodiment.

FIG. 15 is a cross-sectional view illustrating a part of a semiconductor device 300 according to a third embodiment.

The semiconductor device 300 is different from the semiconductor device 100 in that the gate electrode 30 is provided on the $p^-$ type pillar region 3 instead of the electrode 43. The gate electrode 30 is electrically connected to the $p^-$ type pillar region 3. In addition, in the semiconductor device 300, the $n^+$ type source region 7 is selectively provided on the p type base region 6 to contact with the insulating portion 20.

In a case where the semiconductor device 300 is turned on, a voltage equal to or more than the threshold value is applied to the $p^-$ type pillar region 3 through the gate electrode 30. When the voltage is applied to the $p^-$ type pillar region 3, the inversion channel is formed in a region in the vicinity of the insulating portion 20 of the p type base region 6, and the electrons flows from the $n^+$ type source region 7 to the $n^-$ type pillar region 5 through the inversion channel. In addition, at this time, the accumulation channel is formed in a region in the vicinity of the insulating portion 20 of the $n^-$ type pillar region 5.

Even in this embodiment, similarly to the first embodiment, the ON-state resistance and the switching noises can be reduced while suppressing the reduction in the withstand voltage of the semiconductor device and the reduction in the saturated drain current density.

In addition, according to this embodiment, since the $n^+$ type source region 7 contact with the insulating portion 20, the inversion channel and the accumulation channel through which the electrons flow are continuously formed along the insulating portion 20 when the voltage is applied to the p⁻ type pillar region 3. Since the inverse channel and the storage channel are continuously formed, the ON-state resistance of the semiconductor device can be reduced.

(First Modification)

Figure 16:
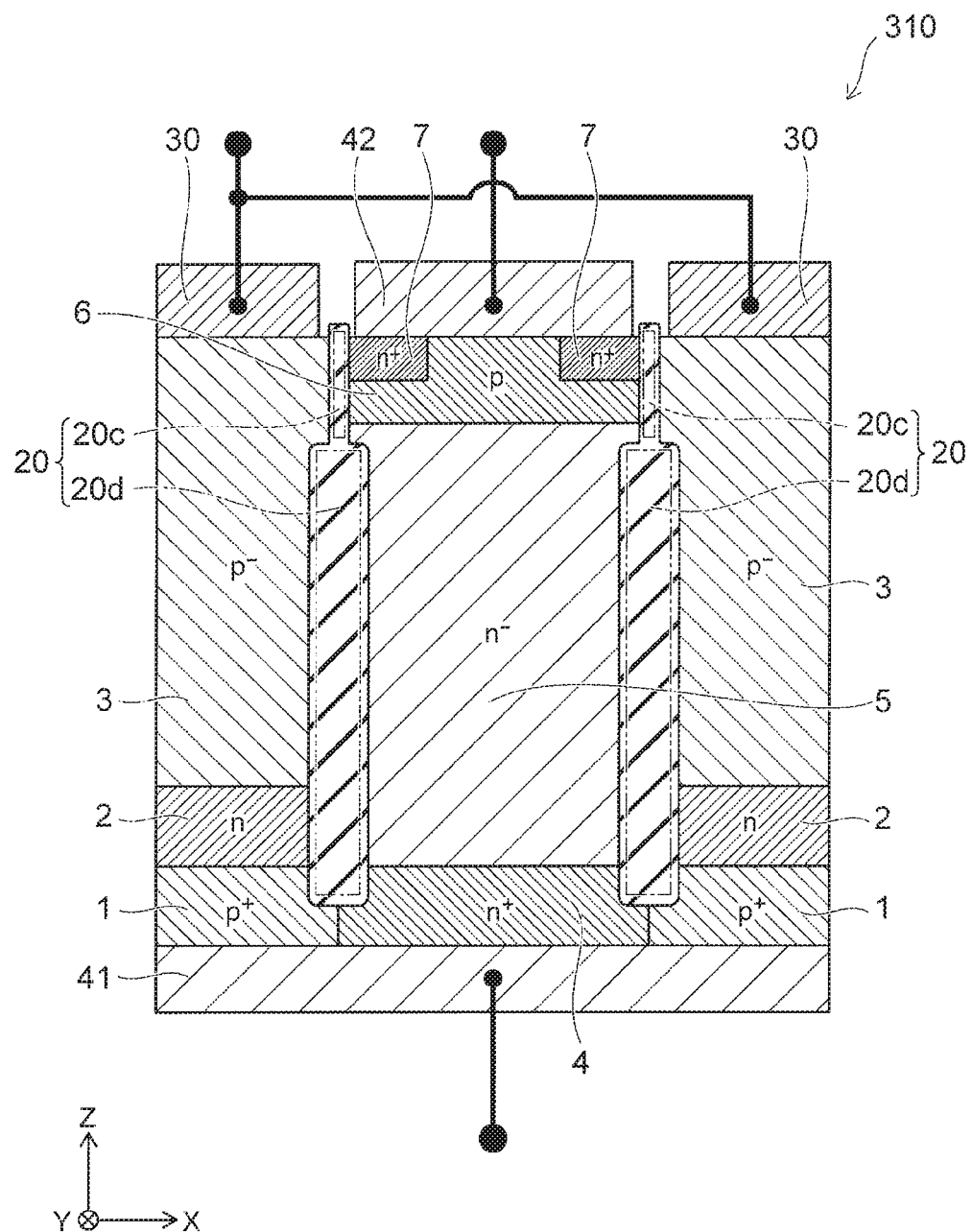
FIG. 16 is a cross-sectional view illustrating a part of a semiconductor device according to a first modification of the third embodiment.

FIG. 16 is a cross-sectional view illustrating a part of a semiconductor device 310 according to the first modification of the third embodiment.

FIG. 16 is different in the structure of the insulating portion 20 compared to the semiconductor device 300.

The insulating portion 20 includes a third insulating portion 20c and a fourth insulating portion 20d. The third insulating portion 20c is aligned with the p type base region 6 in the X direction. The fourth insulating portion 20d is aligned with the n⁻ type pillar region 5 in the X direction. The thickness of the fourth insulating portion 20d in the X direction is thicker than that of the third insulating portion 20c in the X direction.

Since the thickness of the third insulating portion 20c is made relatively thick, the threshold value requiring for turning on the semiconductor device can be reduced. In addition, since the thickness of the fourth insulating portion 20d is relatively thick, the capacitance between the p⁻ type pillar region 3 and the n⁻ type pillar region 5 can be reduced, and the gate-drain capacitance can be reduced.

(Second Modification)

Figure 17:
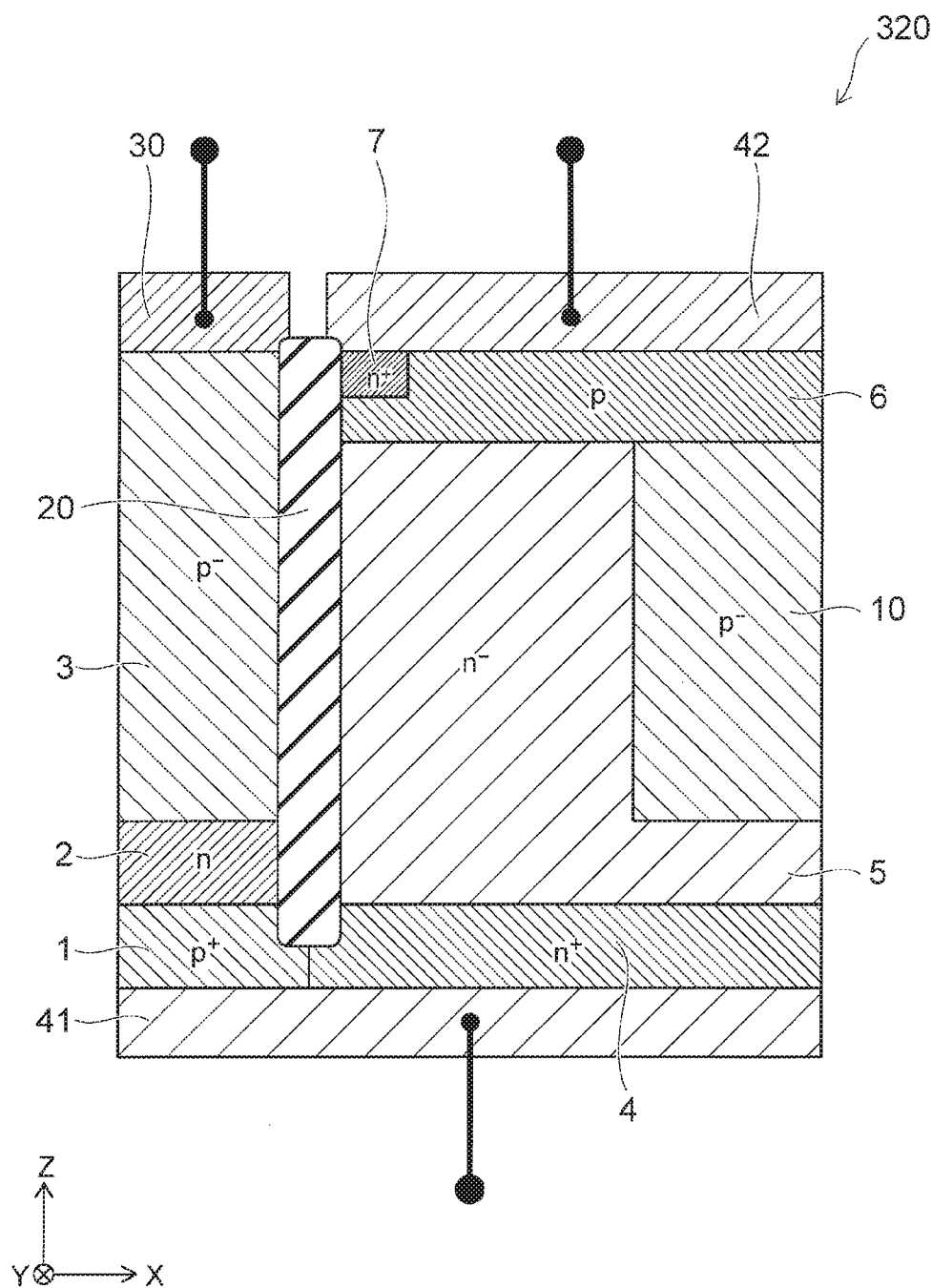
FIG. 17 is a cross-sectional view illustrating a part of a semiconductor device according to a second modification of the third embodiment.

FIG. 17 is a cross-sectional view illustrating a part of a semiconductor device 320 according to a second modification of the third embodiment.

The semiconductor device 320 is different from the semiconductor device 300 in that the p⁻ type semiconductor region 10 is provided instead of a part of the plurality of p⁻ type pillar regions 3.

Similarly to the semiconductor device 210, the p⁻ type semiconductor region 10 is provided between a part of the n⁻ type pillar region 5 and a part of the p type base region 6, and electrically connected to the source electrode 42 through the p type base region 6. Therefore, according to this modification, the gate-drain capacitance can be made small compared to the semiconductor device 300, so that the switching loss can be reduced.

Fourth Embodiment

Figure 18:
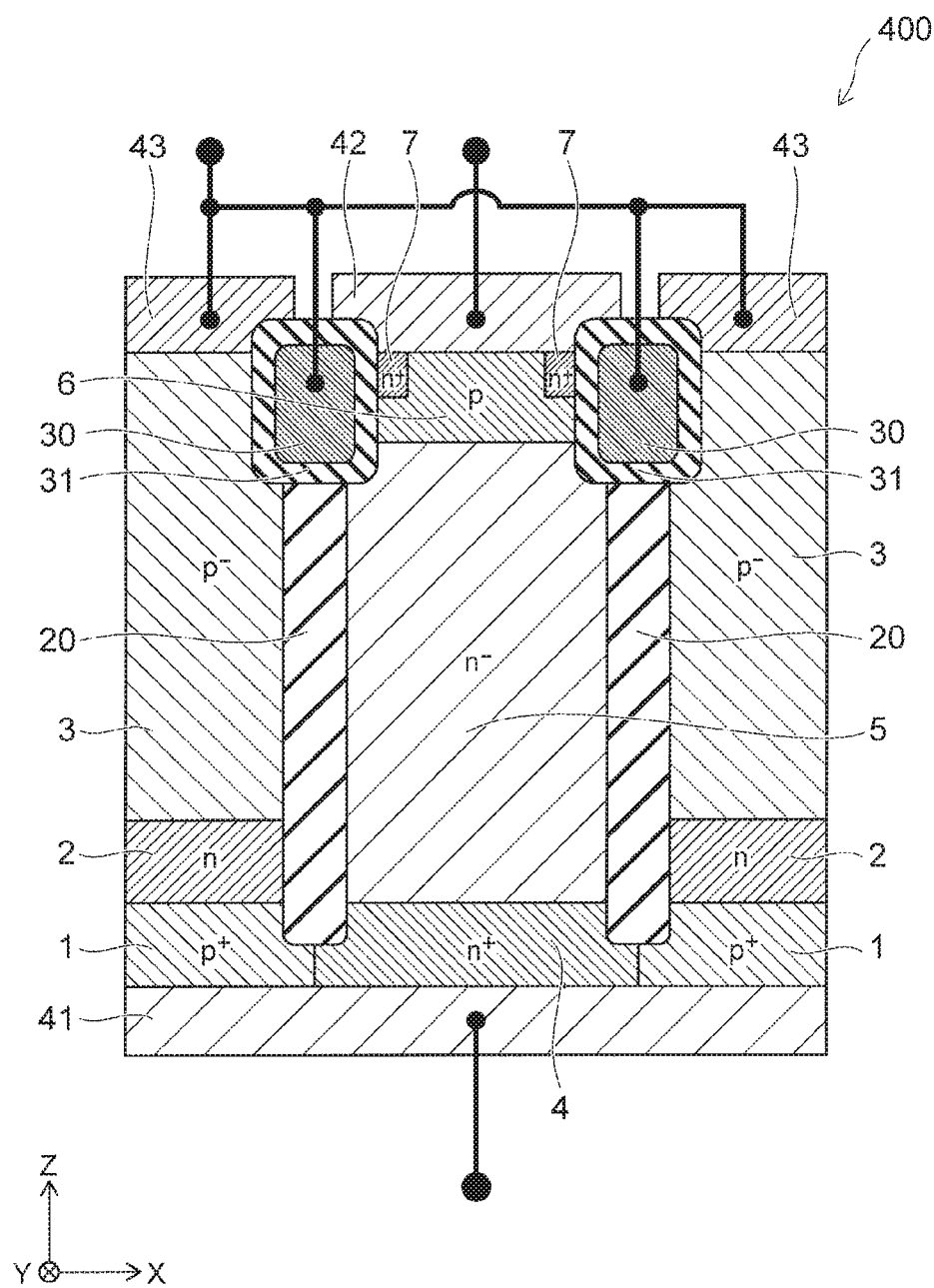
FIG. 18 is a cross-sectional view illustrating a part of a semiconductor device according to a fourth embodiment.

FIG. 18 is a cross-sectional view illustrating a part of a semiconductor device 400 according to a fourth embodiment.

The semiconductor device 400 is different from the semiconductor device 100 in that the gate electrode 30 and the gate insulating layer 31 are provided on the insulating portion 20.

The gate electrode 30 is positioned between the p type pillar region 3 and the p type base region 6.

Since the gate electrode 30 is provided on the insulating portion 20, the inversion channel and the accumulation channel through which the electrons flow are continuously formed along the gate insulating layer 31 and the insulating portion 20 in the ON state.

Therefore, according to this embodiment, the ON-state resistance of the semiconductor device can be reduced compared to the semiconductor device 100.

(First Modification)

Figure 19:
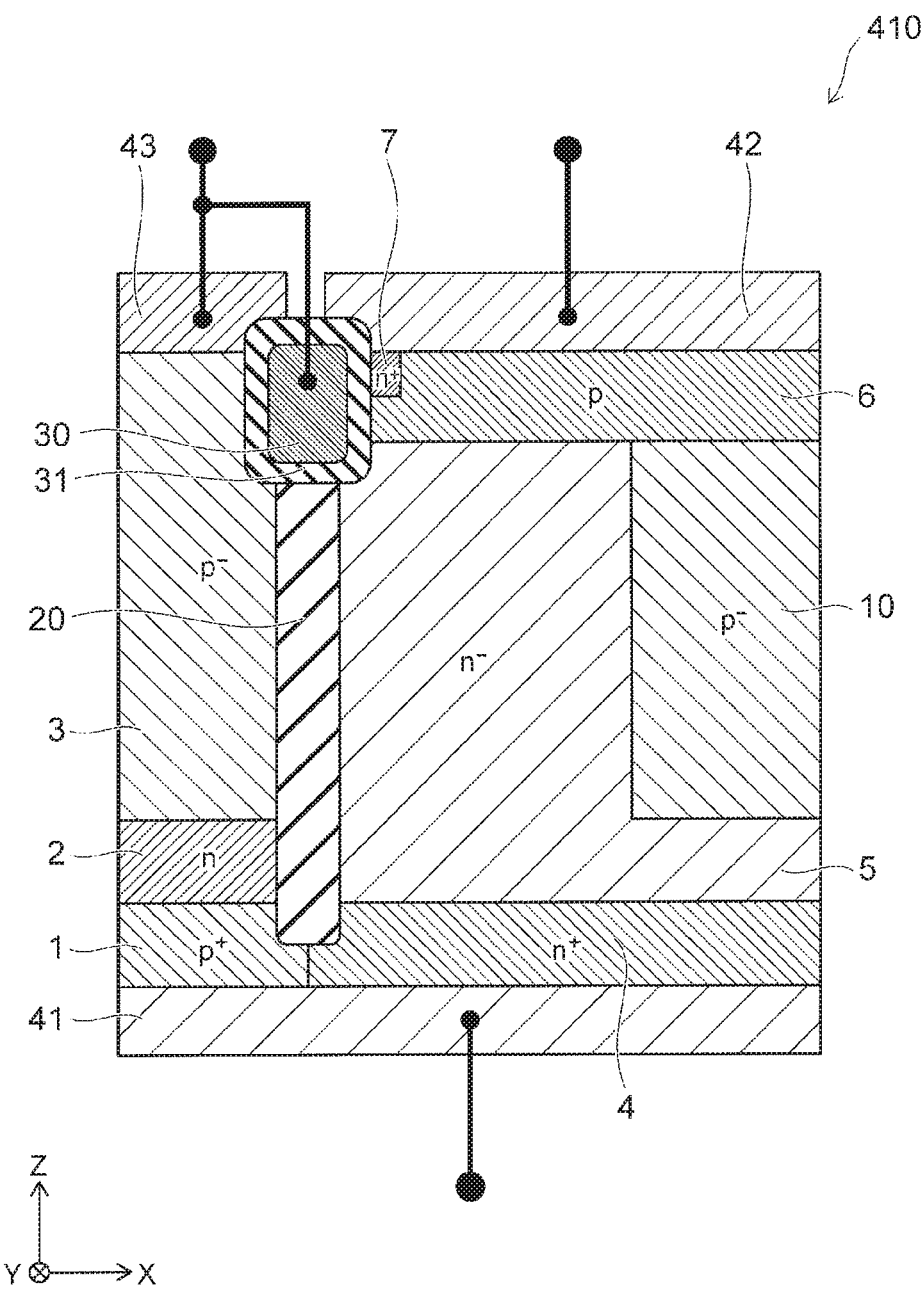
FIG. 19 is a cross-sectional view illustrating a part of a semiconductor device according to a first modification of the fourth embodiment.

FIG. 19 is a cross-sectional view illustrating a part of a semiconductor device 410 according to a first modification of the fourth embodiment.

The semiconductor device 410 is different from the semiconductor device 400 in that the p⁻ type semiconductor region 10 is provided instead of a part of the plurality of p⁻ type pillar regions 3.

Similarly to the semiconductor device 210, the p⁻ type semiconductor region 10 is provided between a part of the n⁻ type pillar region 5 and a part of the p type base region 6, and electrically connected to the source electrode 42 through the p type base region 6.

Therefore, according to this modification, the gate-drain capacitance can be made small compared to the semiconductor device 400, so that the switching loss can be reduced.

Fifth Embodiment

Figure 20:
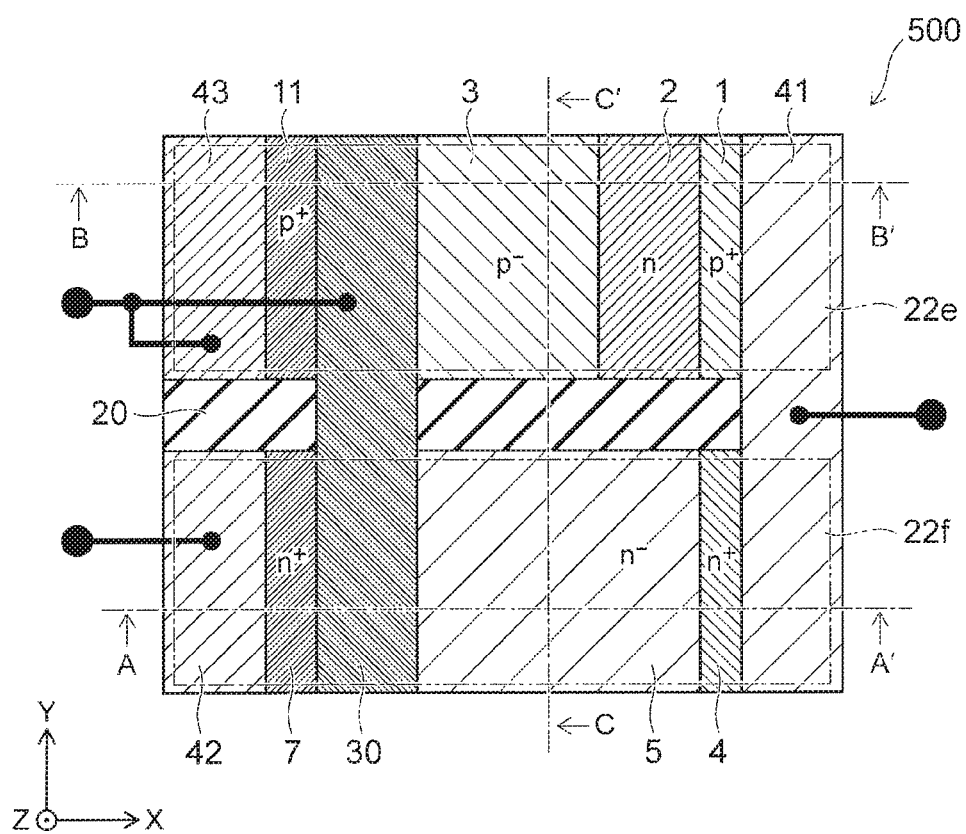
FIG. 20 is a plan view illustrating a part of a semiconductor device according to a fifth embodiment.

FIG. 20 is a plan view illustrating a part of a semiconductor device 500 according to a fifth embodiment.

Figure 21A:
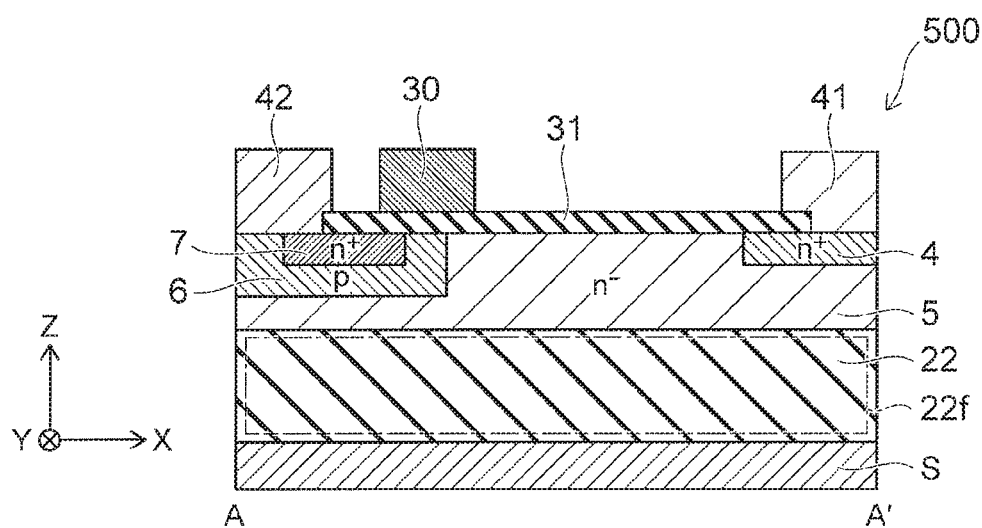
FIGS. 21A to 21C are cross-sectional views illustrating a part of the semiconductor device according to the fifth embodiment.
Figure 21B:
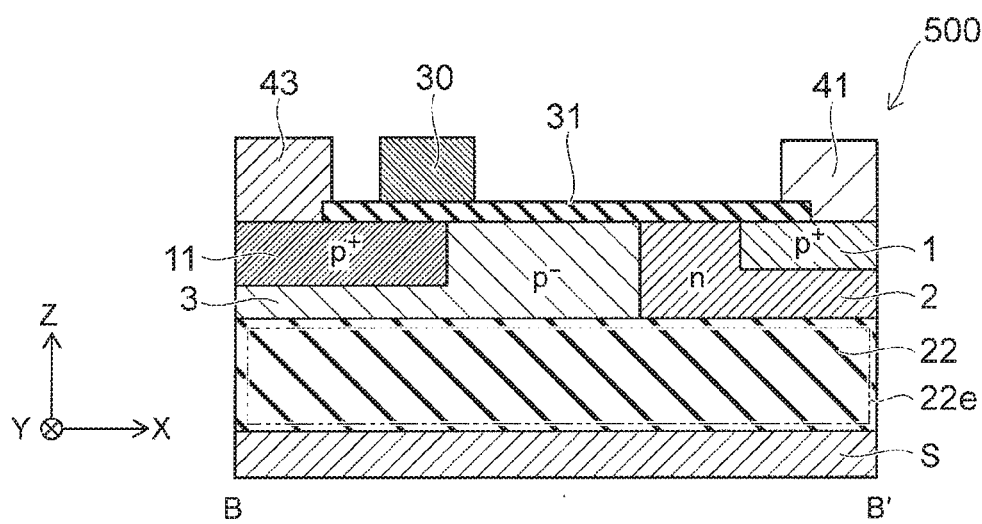
Figure 21C:
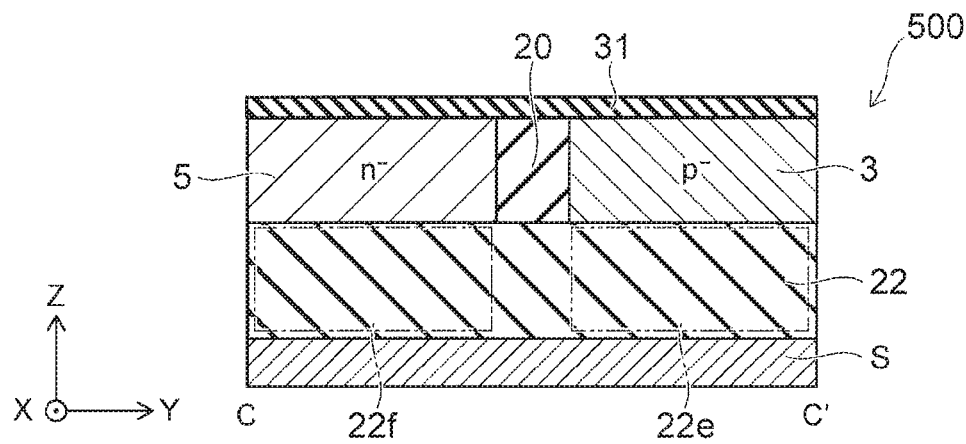

FIGS. 21A to 21C are cross-sectional views illustrating a part of the semiconductor device 500 according to the fifth embodiment. Specifically, FIG. 21A is a cross-sectional view taken along line A-A' of FIG. 20. FIG. 21B is a cross-sectional view taken along line B-B' of FIG. 20. FIG. 21C is a cross-sectional view taken along line C-C' of FIG. 20.

Further, in FIG. 20, the gate insulating layer 31 is omitted. In addition, in FIG. 20, a fifth insulating portion 22e and a sixth insulating portion 22f of an insulating portion 22 are illustrated by broken lines.

The semiconductor device 500 is, for example, a lateral MOSFET.

As illustrated in FIGS. 20 and 21, the semiconductor device 500 includes a substrate S, the p⁺ type drain region 1 (the first semiconductor region), the n type buffer region 2 (the second semiconductor region), the p⁻ type pillar region 3 (the third semiconductor region), the n⁺ type drain region 4, the n⁻ type pillar region 5 (the fifth semiconductor region), the p type base region 6 (the sixth semiconductor region), the n⁺ type source region 7 (the seventh semiconductor region), a p⁺ type contact region 11, the insulating portion 20 (the first insulating portion), the insulating portion 22 (the second insulating portion), the gate electrode 30, the gate insulating layer 31, the drain electrode 41 (the first electrode), the source electrode 42 (the second electrode), and the electrode 43 (the third electrode).

The insulating portion 22 is provided on the substrate S. The insulating portion 22 includes the fifth insulating portion 22e and the sixth insulating portion 22f. The fifth insulating portion 22e and the sixth insulating portion 22f are arranged in the Y direction.

The n type buffer region 2 is provided on a part of the fifth insulating portion 22e.

The p⁻ type pillar region 3 is provided on another part of the fifth insulating portion 22e.

The n type buffer region 2 and the p⁻ type pillar region 3 are arranged in the X direction.

The p⁺ type drain region 1 is selectively provided on the n type buffer region 2 to be separated from the p⁻ type pillar region 3.

The p⁺ type contact region 11 is selectively provided on the p⁻ type pillar region 3 to be separated from the n type buffer region 2.

The n⁻ type pillar region 5 is provided on the sixth insulating portion 22f, and separated from the n type buffer region 2 and the p⁻ type pillar region 3.

The n⁺ type drain region 4 is selectively provided on the n⁻ type pillar region 5.

The p type base region 6 is selectively provided on the n⁻ type pillar region 5 to be separated from the n⁺ type drain region 4.

The n⁺ type source region 7 is selectively provided on the p type base region 6.

The insulating portion 20 is provided between the n type buffer region 2 and the n⁻ type pillar region 5 and between the p⁻ type pillar region 3 and the n⁻ type pillar region 5, and divides a semiconductor region provided on the fifth insulating portion 22e and a semiconductor region provided on the sixth insulating portion 22f in the Y direction.

The gate insulating layer 31 is provided over a range from a part of the n⁺ type drain region 4 and a part of the n⁺ type source region 7, and covers the surface of the n type pillar region 5 and the surface of a part of the p type base region 6 which are positioned therebetween.

The drain electrode 41 is provided on the p⁺ type drain region 1 and the n⁺ type drain region 4, and electrically connected to these semiconductor regions.

The source electrode 42 is provided on the n⁺ type source region 7, and electrically connected to the n⁺ type source region 7.

The gate electrode 30 is provided on the gate insulating layer 31, and a part thereof is positioned between the drain electrode 41 and the source electrode 42. In addition, the gate electrode 30 faces a part of the n⁻ type pillar region 5, a part of the n⁺ type source region 7, and a part of the p type base region 6 which are positioned therebetween, through the gate insulating layer 31.

The electrode 43 is provided on the p⁺ type contact region 11, and electrically connected to the p⁺ type contact region 11 and the gate electrode 30. The p⁻ type pillar region 3 is electrically connected to the electrode 43 through the p⁺ type contact region 11.

Here, the operation of the semiconductor device 500 will be described.

The basic operational principle is the same as that of the semiconductor device 100. In other words, when a voltage equal to or more than the threshold value is applied to the gate electrode 30 in a state where a positive voltage with respect to the source electrode 42 is applied to the drain electrode 41, the inversion channel is formed in the surface of the p type base region 6 immediately below the gate electrode 30. At the same time, the electron accumulation channel is formed in a region in the vicinity of the insulating portion 20 of the n⁻ type pillar region 5. Thereafter, when the voltage applied to the gate electrode 30 is less than the threshold value, the MOSFET enters the OFF state, and the inversion channel and the accumulation channel disappear.

According to this embodiment, the ON-state resistance of the semiconductor device can be reduced while suppressing the reduction in the withstand voltage of the semiconductor device by the accumulation channel formed in the n⁻ type pillar region 5 in the ON state. In addition, the gate-drain capacitance can be made large by electrically connecting the p⁻ type pillar region 3 to the gate electrode 30. Therefore, the controllability of the voltage change rate of the drain at the time of switching using the external gate resistor can be improved, and the switching noises can be easily suppressed.

In other words, according to this embodiment, similarly to the first embodiment, the ON-state resistance and the switching noises can be reduced while suppressing the reduction in the withstand voltage of the semiconductor device and the reduction in the saturated drain current density.

In addition, similarly to the first embodiment, the n type impurity concentration of the n type buffer region 2 is increased more than that of the n⁻ type pillar region 5, so that the possibility of the operation of the parasitic p type MOSFET is reduced, and the operation of the semiconductor device 500 can be made stable.

(First Modification)

Figure 22A:
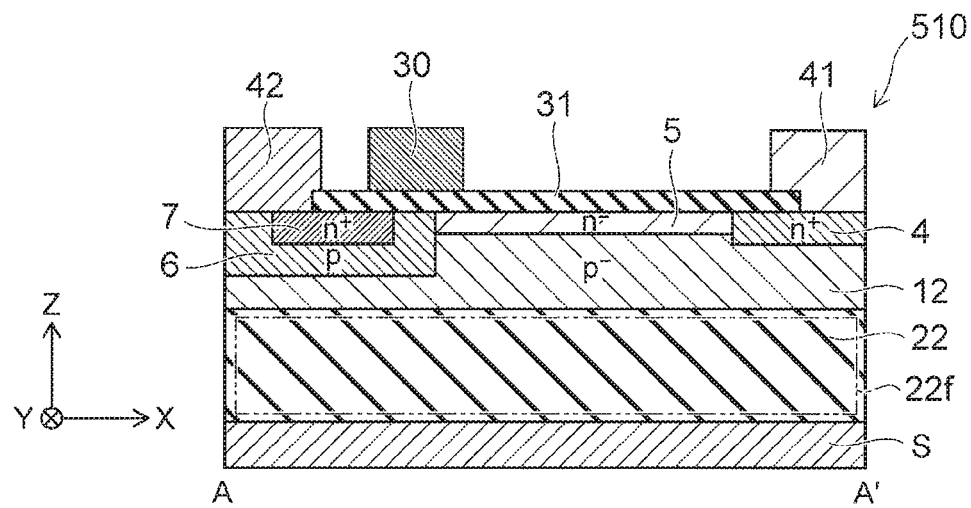
FIGS. 22A to 22C are cross-sectional views illustrating a part of a semiconductor device according to a first modification of the fifth embodiment.
Figure 22B:
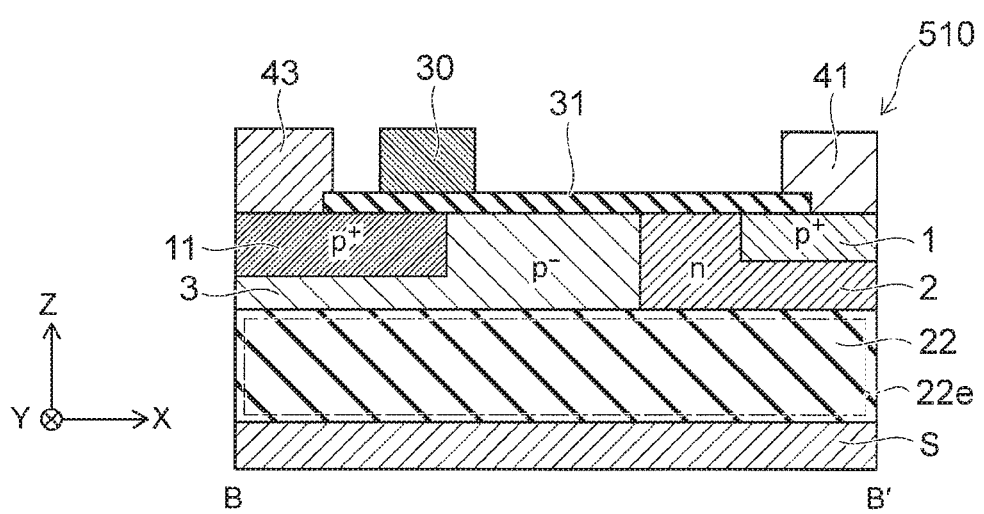
Figure 22C:
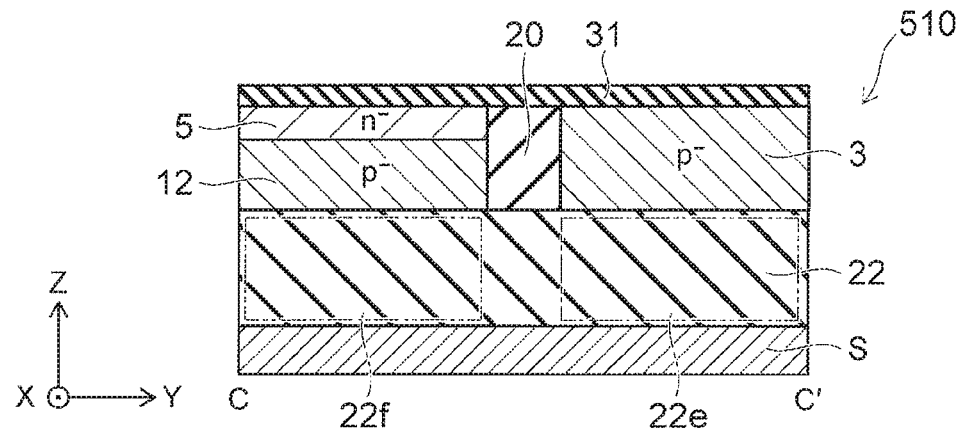

FIGS. 22A to 22C are cross-sectional views illustrating a part of a semiconductor device 510 according to a first modification of the fifth embodiment. The plan view of the semiconductor device 510 is the same as that of FIG. 20. FIG. 22A corresponds to the cross section taken along line A-A' of FIG. 20. FIG. 22B corresponds to the cross section taken along line B-B' of FIG. 20. FIG. 22C corresponds to the cross section taken along line C-C' of FIG. 20.

The semiconductor device 510 is different from the semiconductor device 500 in that a p⁻ type semiconductor region 12 is further provided.

The p⁻ type semiconductor region 12 is provided between the insulating portion 22 and each of the n⁺ type drain region 4, the n⁻ type pillar region 5, and the p type base region 6. The n⁻ type pillar region 5 is provided on the p⁻ type semiconductor region 12, and positioned between the n⁺ type drain region 4 and the p type base region 6.

Even in the structure according to this modification, the same operation as that of the semiconductor device 500 can be made. In addition, similarly to the semiconductor device 500, the ON-state resistance and the switching noises can be reduced while suppressing the reduction in the withstand voltage of the semiconductor device and the reduction in the saturated drain current density.

(Second Modification)

Figure 23A:
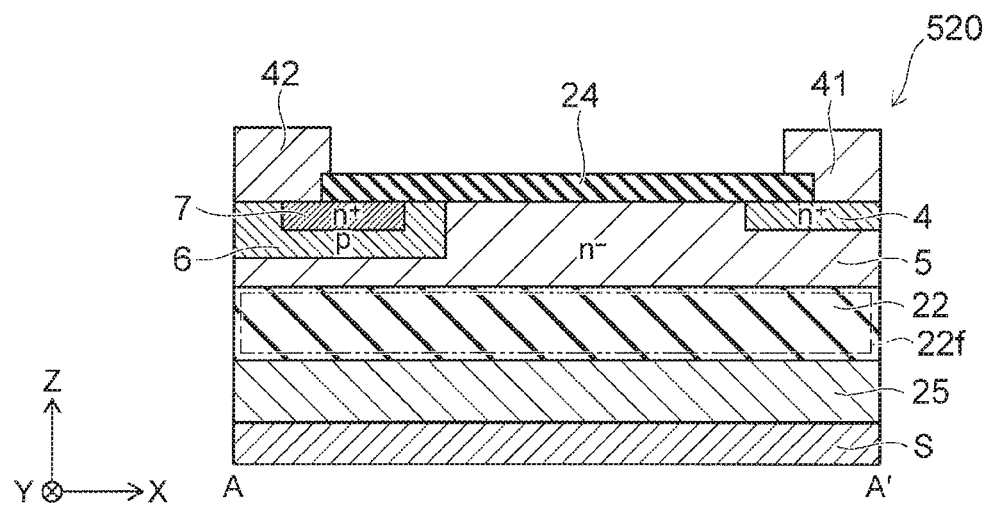
FIGS. 23A to 23C are cross-sectional views illustrating a part of a semiconductor device according to a second modification of the fifth embodiment.
Figure 23B:
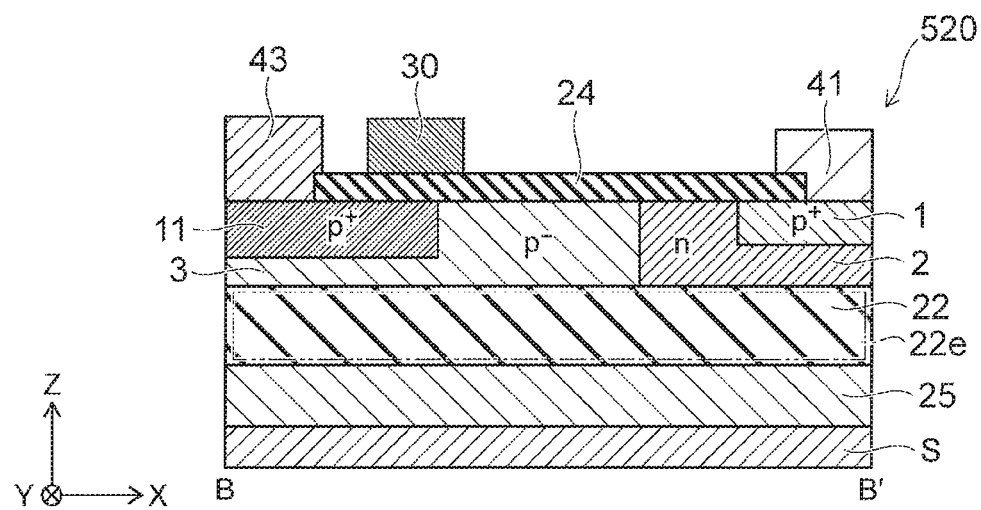
Figure 23C:
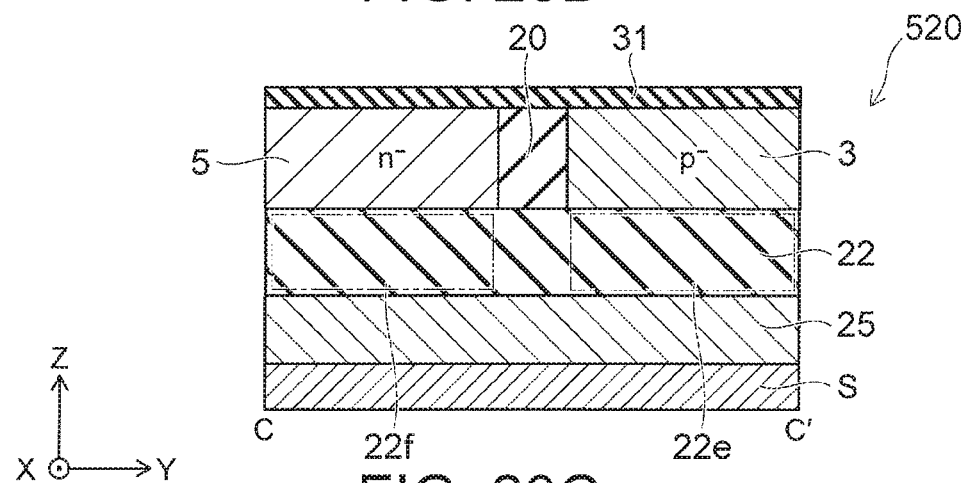

FIGS. 23A to 23C are cross-sectional views illustrating a part of a semiconductor device 520 according to a second modification of the fifth embodiment. The plan view of the semiconductor device 520 is the same as that of FIG. 20. FIG. 23A corresponds to the cross section taken along line A-A' of FIG. 20. FIG. 23B corresponds to the cross section taken along line B-B' of FIG. 20. FIG. 23C corresponds to the cross section taken along line C-C' of FIG. 20.

The semiconductor device 520 is different from the semiconductor device 500 in that a semiconductor region 25 is further provided.

The semiconductor region 25 is a high resistance region, and provided between the substrate S and the insulating portion 22. In the semiconductor region 25, p type or n type impurities may be added. In this case, the p type impurity concentration of the semiconductor region 25 is lower than that of the p⁻ type pillar region 3, and the n type impurity concentration of the semiconductor region 25 is lower than that of the n⁻ type pillar region 5.

In a lateral MOSFET such as the semiconductor device 500, the substrate S may be set to a source voltage. In this case, a source-drain voltage is applied between the substrate S and a region on a side near the drain electrode 41 of the n⁻ type pillar region 5.

The semiconductor region 25 is provided between the substrate S and the insulating portion 22, so that the distance between each semiconductor region provided on the insulating portion 22 and the substrate S can be made large, thereby the withstand voltage of the semiconductor device can be improved.

Alternatively, the thickness of the insulating portion 22 can be made thin while suppressing the reduction in the withstand voltage of the semiconductor device by providing the semiconductor region 25. Since it takes a lot of time for forming a thick insulating layer, when the insulating portion 22 is made thin, the productivity of the semiconductor device can be improved. In addition, the bending of the semiconductor device can be made small by making the insulating portion 22 thin, and a yield of the semiconductor device can be improved.

Sixth Embodiment

Figure 24:
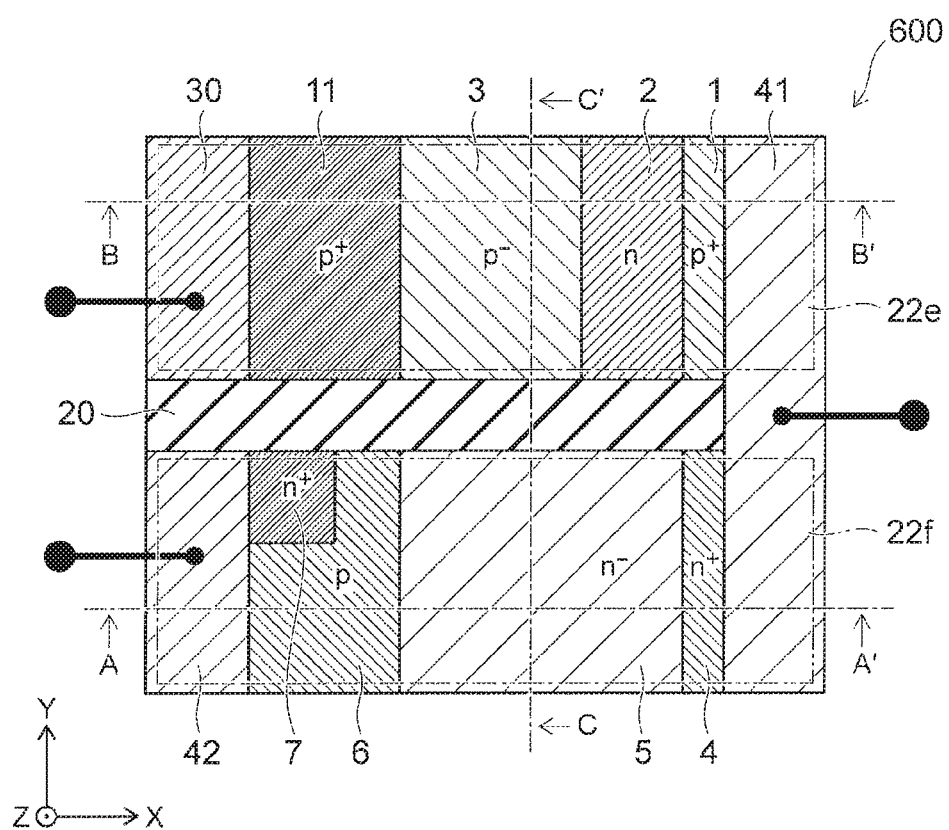
FIG. 24 is a plan view illustrating a part of a semiconductor device according to a sixth embodiment.

FIG. 24 is a plan view illustrating a part of a semiconductor device 600 according to a sixth embodiment.

Figure 25A:
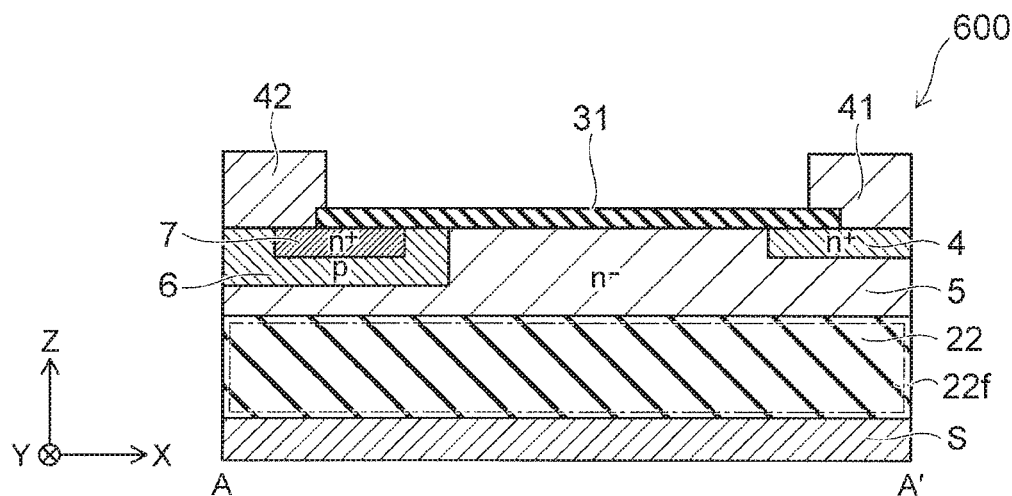
FIGS. 25A to 25C are cross-sectional views illustrating a part of the semiconductor device according to the sixth embodiment.
Figure 25B:
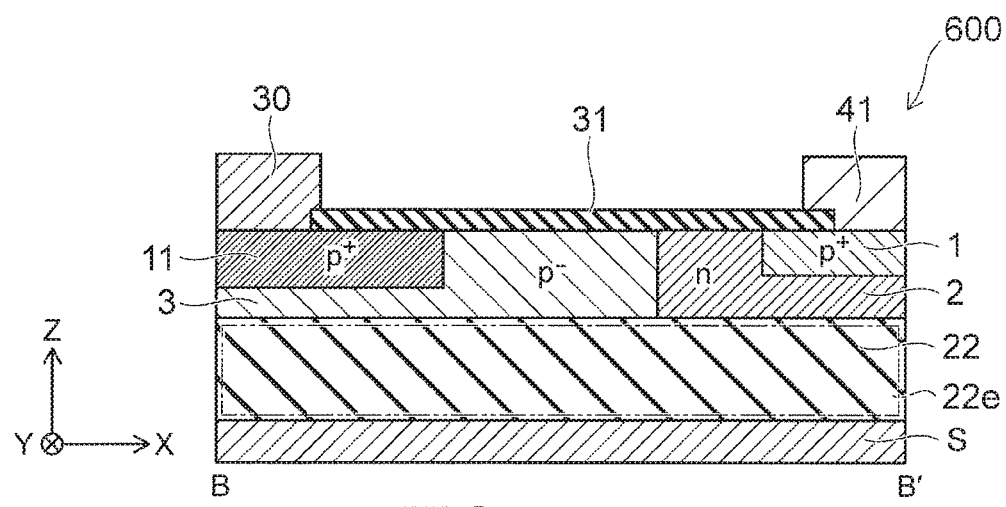
Figure 25C:
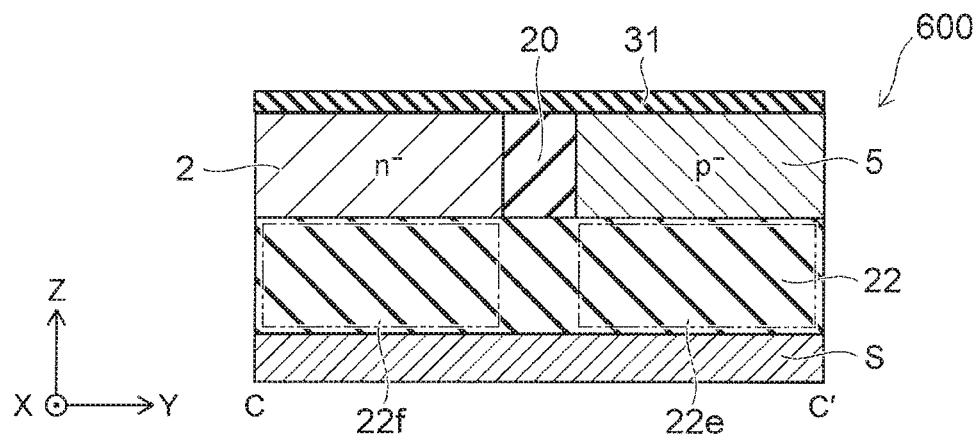

FIGS. 25A to 25C are cross-sectional views illustrating a part of the semiconductor device 600 according to the sixth embodiment. Specifically, FIG. 25A is a cross-sectional view taken along line A-A' of FIG. 24. FIG. 25B is a cross-sectional view taken along line B-B' of FIG. 24. FIG. 25C is a cross-sectional view taken along line C-C' of FIG. 24.

Besides, in FIG. 24, the insulating layer 31 is omitted, but it may be included.

The semiconductor device 600 is different from the semiconductor device 500 in that the gate electrode 30 is provided on the $p^+$ type contact region 11 instead of the electrode 43. The gate electrode 30 is aligned with the source electrode 42 in the Y direction.

In a case where the semiconductor device 600 is turned on, a voltage equal to or more than the threshold value is applied to the $p^-$ type pillar region 3 through the gate electrode 30. When the voltage is applied to the $p^-$ type pillar region 3, the inversion channel is formed in a region in the vicinity of the insulating portion 20 of the p type base region 6, and the accumulation channel is formed in a region in the vicinity of the insulating portion 20 of the $n^-$ type pillar region 5.

Even in this embodiment, similarly to the fifth embodiment, the ON-state resistance and the switching noises can be reduced while suppressing the reduction in the withstand voltage of the semiconductor device and the reduction in the saturated drain current density.

In addition, according to this embodiment, since the $n^+$ type source region 7 contacts with the insulating portion 20, the inversion channel and the accumulation channel are continuously formed along the insulating portion 20 when the voltage is applied to the $p^-$ type pillar region 3. Since the inversion channel and the accumulation channel are continuously formed, the ON-state resistance of the semiconductor device can be reduced.

Seventh Embodiment

Figure 26:
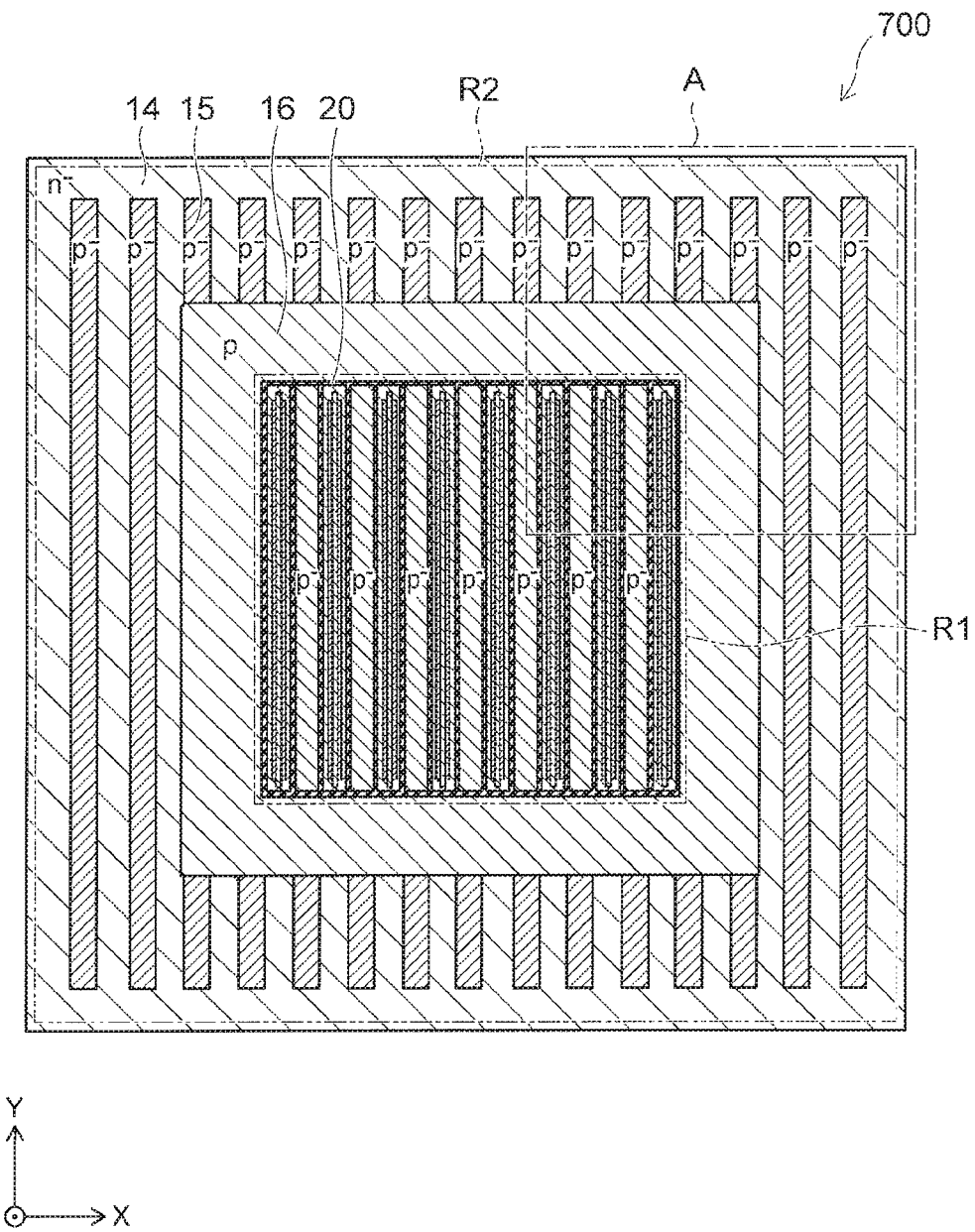
FIG. 26 is a plan view of a semiconductor device according to a seventh embodiment.
Figure 27:
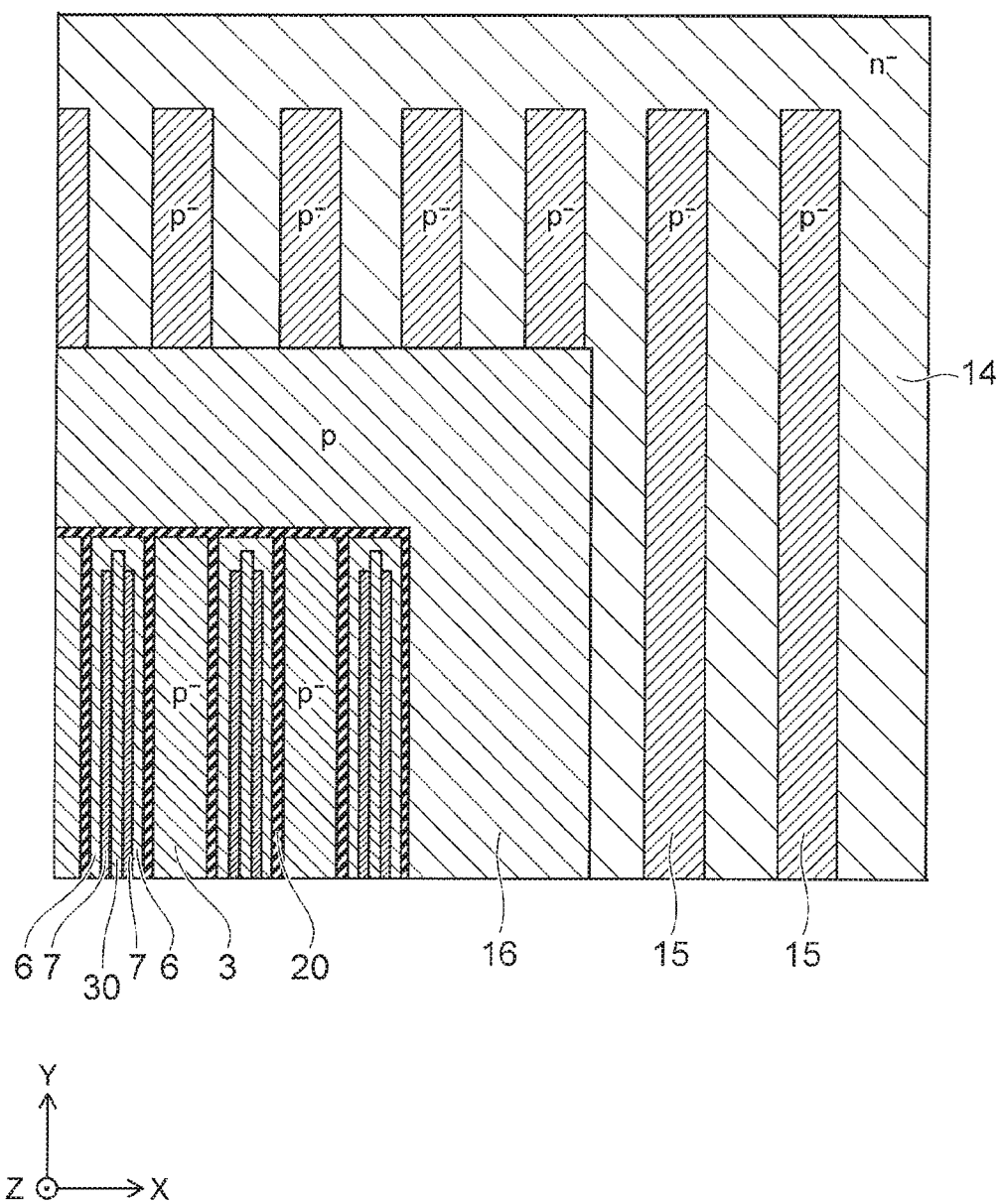
FIG. 27 is a plan view of Portion A of FIG. 26 on a magnified scale.
Figure 28:
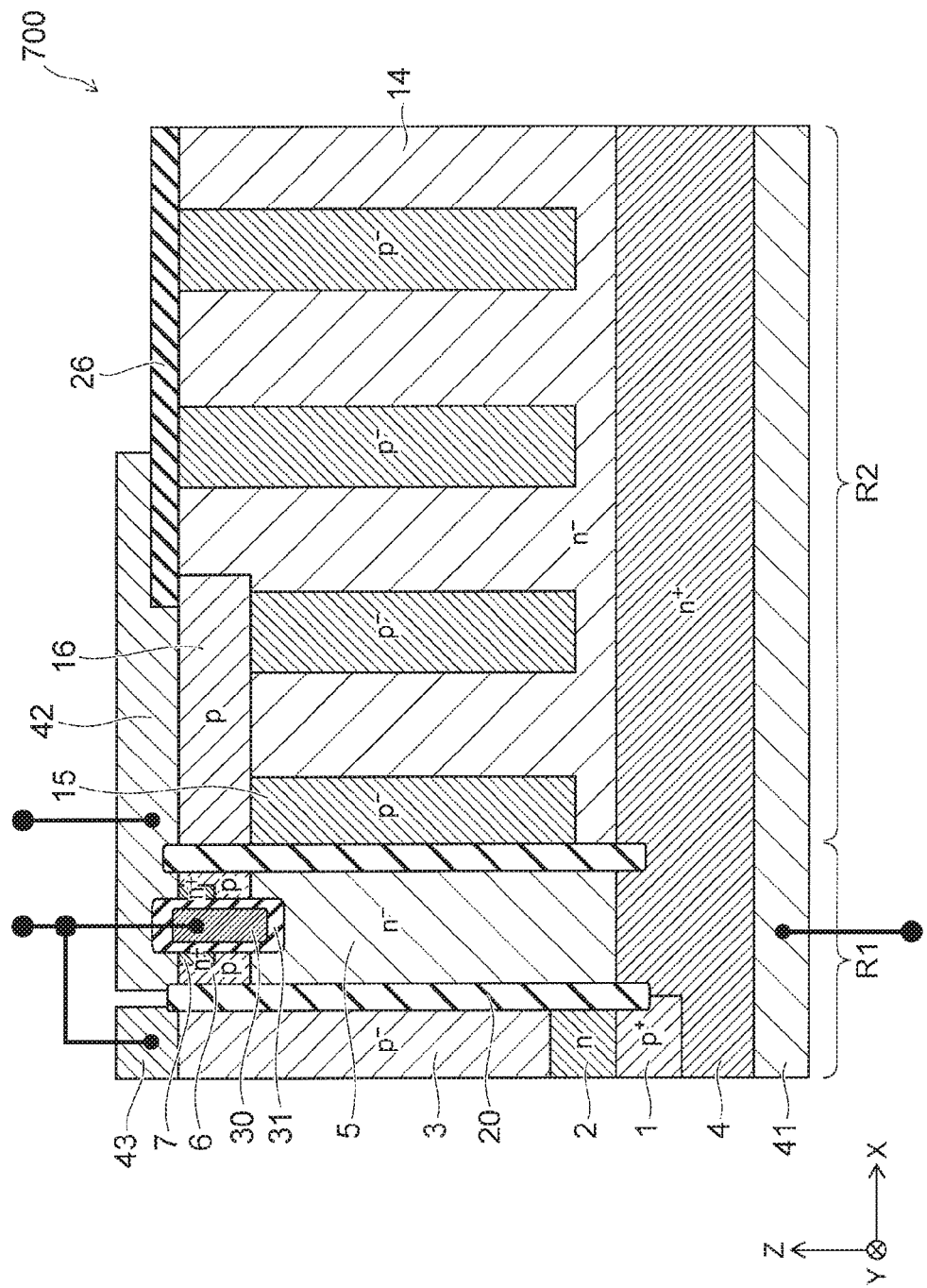
FIG. 28 is a cross-sectional view taken along line B-B' of FIG. 27.

FIG. 26 is a plan view of a semiconductor device 700 according to a seventh embodiment. FIG. 27 is a plan view illustrating Portion A of FIG. 26 on a magnified scale. FIG. 28 is a cross-sectional view taken along line B-B' of FIG. 27.

Besides, in FIGS. 26 and 27, an insulating layer 26, the gate insulating layer 31, the source electrode 42, and the electrode 43 are omitted.

As illustrated in FIG. 26, the semiconductor device 700 includes an element region R1 and a termination region R2. The element region R1 is a region including the center of the semiconductor device 700. The termination region R2 is provided around the element region R1.

In the element region R1, the same structure as that of the semiconductor device 140 illustrated in FIG. 10 is provided. In other words, the element region R1 includes the p type drain region 1, the n type buffer region 2, the $p^-$ type pillar region 3, the $n^-$ type pillar region 5, the p type base region 6, the $n^+$ type source region 7, the insulating portion 20, the gate electrode 30, the gate insulating layer 31, and the electrode 43.

The termination region R2 includes an $n^-$ type semiconductor region 14, a $p^-$ type semiconductor region 15, a p type semiconductor region 16, and the insulating layer 26.

The drain electrode 41, the $n^+$ type drain region 4, and the source electrode 42 are provided in both of the element region R1 and the termination region R2.

As illustrated in FIGS. 26 to 28, the $p^-$ type pillar region 3, the $n^-$ type pillar region 5, the p type base region 6, the $n^+$ type source region 7, and the gate electrode 30 are surrounded by the insulating portion 20.

The $n^-$ type semiconductor region 14 is provided around the insulating portion 20 on the $n^+$ type drain region 4. The $p^-$ type semiconductor region 15 is selectively provided on the $n^-$ type semiconductor region 14.

A plurality of $p^-$ type semiconductor regions 15 are provided in the X direction to be separated from each other. A part of the $n^-$ type semiconductor region 14 and each $p^-$ type semiconductor region 15 are alternately provided in the X direction. In addition, a part of the plurality of $p^-$ type semiconductor regions 15 is aligned with the p type pillar region 3 in the Y direction.

The p type semiconductor region 16 is provided around the insulating portion 20 on the $n^-$ type semiconductor region 14 and on the $p^-$ type semiconductor region 15. A part of the source electrode 42 is positioned on the p type semiconductor region 16, and electrically connected to the p type semiconductor region 16.

The insulating layer 26 covers the surface of the $n^-$ type semiconductor region 14 and the surface of the $p^-$ type semiconductor region 15 around the p type semiconductor region 16.

When the semiconductor device 700 is switched from the ON state to the OFF state, the depletion layer is spread from the pn junction plane between the $n^-$ type semiconductor region 14 and the p type semiconductor region 16 in the vertical direction, and the depletion layer is spread from the pn junction plane between the $n^-$ type semiconductor region 14 and the $p^-$ type semiconductor region 15 in the horizontal direction. Since a part of the $n^-$ type semiconductor region 14 and the $p^-$ type semiconductor region 15 are depleted, the withstand voltage in the termination region R2 is secured.

According to this embodiment, the semiconductor device having the termination region according to the embodiments of the described-above lateral MOSFET is provided.

In addition, according to this embodiment, a part of the $n^-$ type semiconductor region 14 and the $p^-$ type semiconductor region 15 contact with on each other and are alternately provided without providing the insulating portion 20 in the termination region R2. In a case where such a structure is employed, the impurities are alternately diffused when the $n^-$ type semiconductor region 14 and the $p^-$ type semiconductor region 15 are formed. Therefore, the n type impurity concentration of the $n^-$ type semiconductor region 14 and the p type impurity concentration of the $p^-$ type semiconductor region 15 are reduced, and these semiconductor regions are easily depleted when the semiconductor device enters the OFF state. In other words, it is possible to improve the withstand voltage in the termination region R2.

In the examples illustrated in FIGS. 26 to 28, the description has been made about that the element region R1 has the same structure as that of the semiconductor device 140, but the semiconductor device 700 may be configured such that the element region R1 has the same structure as the semiconductor devices according to the other embodiments.

(First Modification)

Figure 29:
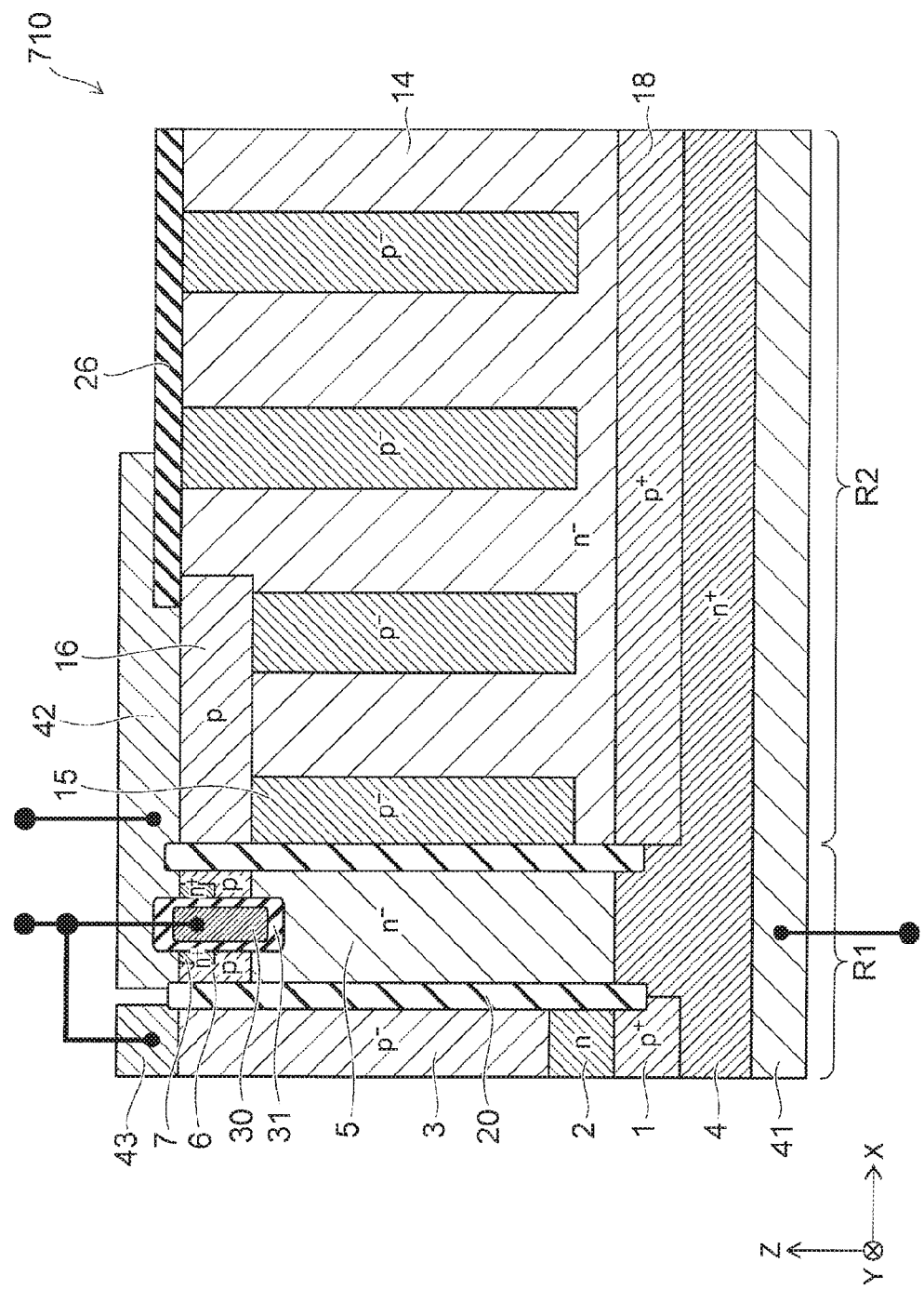
FIG. 29 is a cross-sectional view of a semiconductor device according to a first modification of the seventh embodiment.

FIG. 29 is a cross-sectional view of a semiconductor device 710 according to a first modification of the seventh embodiment.

The plan view of the semiconductor device 710 is the same as those of FIGS. 26 and 27. FIG. 29 corresponds to the cross-sectional view taken along line B-B' of FIG. 27.

The semiconductor device 710 is different from the semiconductor device 700 in that a p$^+$ type semiconductor region 18 is provided in the termination region R2.

The p$^+$ type semiconductor region 18 is provided between the n$^+$ type drain region 4 and the n$^-$ type semiconductor region 14 in the termination region R2.

The semiconductor device 700 includes a parasitic diode of which the anode is the p type semiconductor region 16 and the p$^-$ type semiconductor region 15 and the cathode is the n$^-$ type semiconductor region 14 and the n$^+$ type drain region 4, in the termination region R2. The parasitic diode does not operate by providing the p$^+$ type semiconductor region 18. Therefore, according to this modification, a tolerance amount at the time of recovery when the parasitic diode is switched from the ON state to the OFF state can be improved.

(Second Modification)

Figure 30:
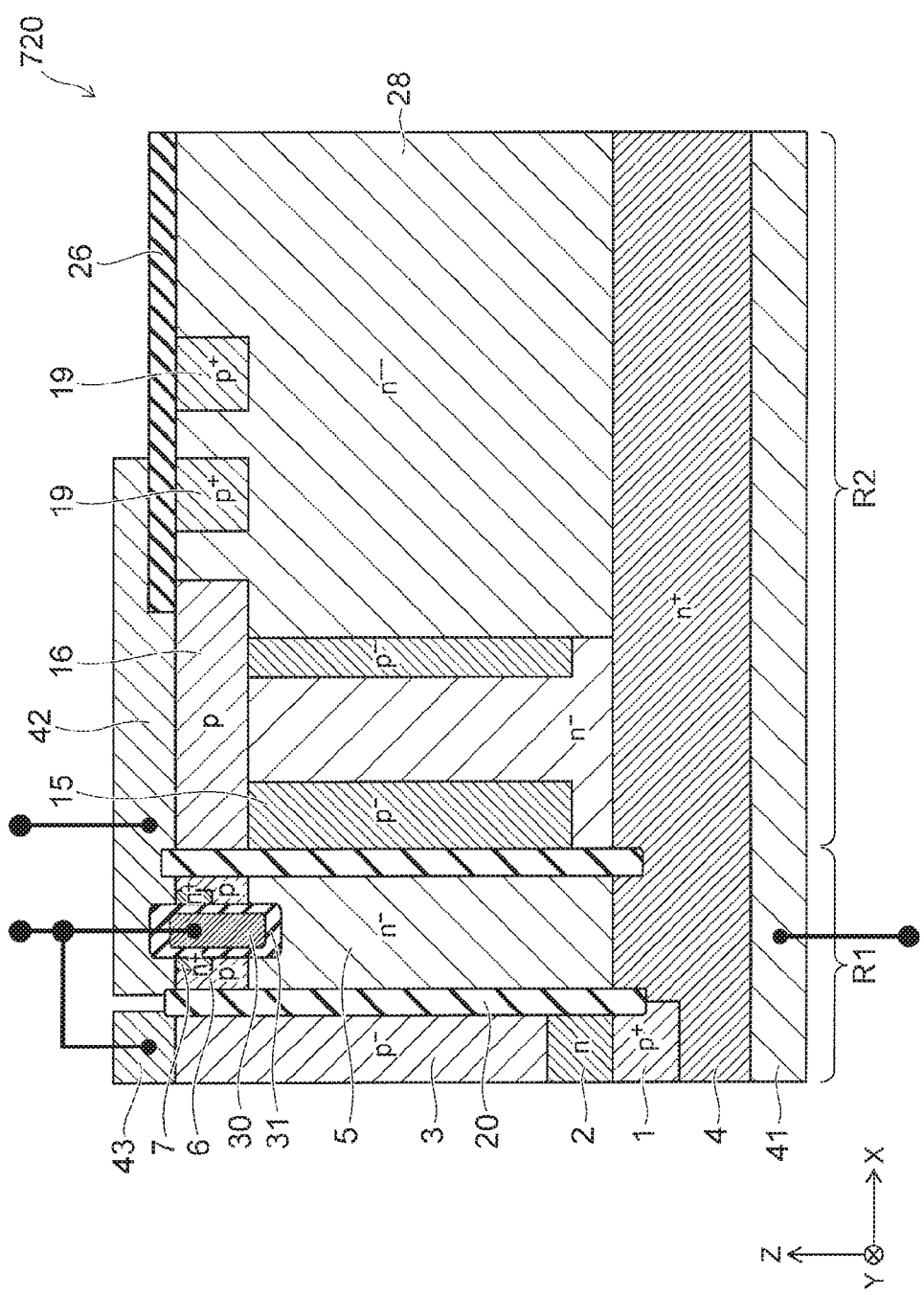
FIG. 30 is a cross-sectional view of a semiconductor device according to a second modification of the seventh embodiment.

FIG. 30 is a cross-sectional view of a semiconductor device 720 according to a second modification of the seventh embodiment.

The plan view of the semiconductor device 710 is the same as those of FIGS. 26 and 27. FIG. 30 corresponds to the cross-sectional view taken along line B-B' of FIG. 27.

The semiconductor device 720 is different from the semiconductor device 700 in that a p$^+$ type semiconductor region 19 and an n$^{--}$ type semiconductor region 28 are further included instead of a part of the n$^-$ type semiconductor region 14 and a part of the plurality of p$^-$ type semiconductor regions 15.

The n$^{--}$ type semiconductor region 28 is provided around the n$^-$ type semiconductor region 14 and the plurality of p$^-$ type semiconductor regions 15, on the n$^+$ type drain region 4.

The n$^{--}$ type semiconductor region 28 has electric resistance higher than those of the n$^-$ type semiconductor region 14 and the p$^-$ type semiconductor region 15. On the n$^{--}$ type semiconductor region 28, a plurality of p$^+$ type semiconductor regions 19 are provided. The respective p$^+$ type semiconductor regions 19 are provided to be separated from each other. In addition, the p$^+$ type semiconductor region 19 is provided in a circular shape to surround the p type semiconductor region 16.

The p$^+$ type semiconductor region 19 serves as a guard ring, and suppresses that an electric field is concentrated on the end portion of the p type semiconductor region 16.

According to this modification, similarly to the semiconductor device 700, the withstand voltage in the termination region R2 can be improved.

(Third Modification)

Figure 31:
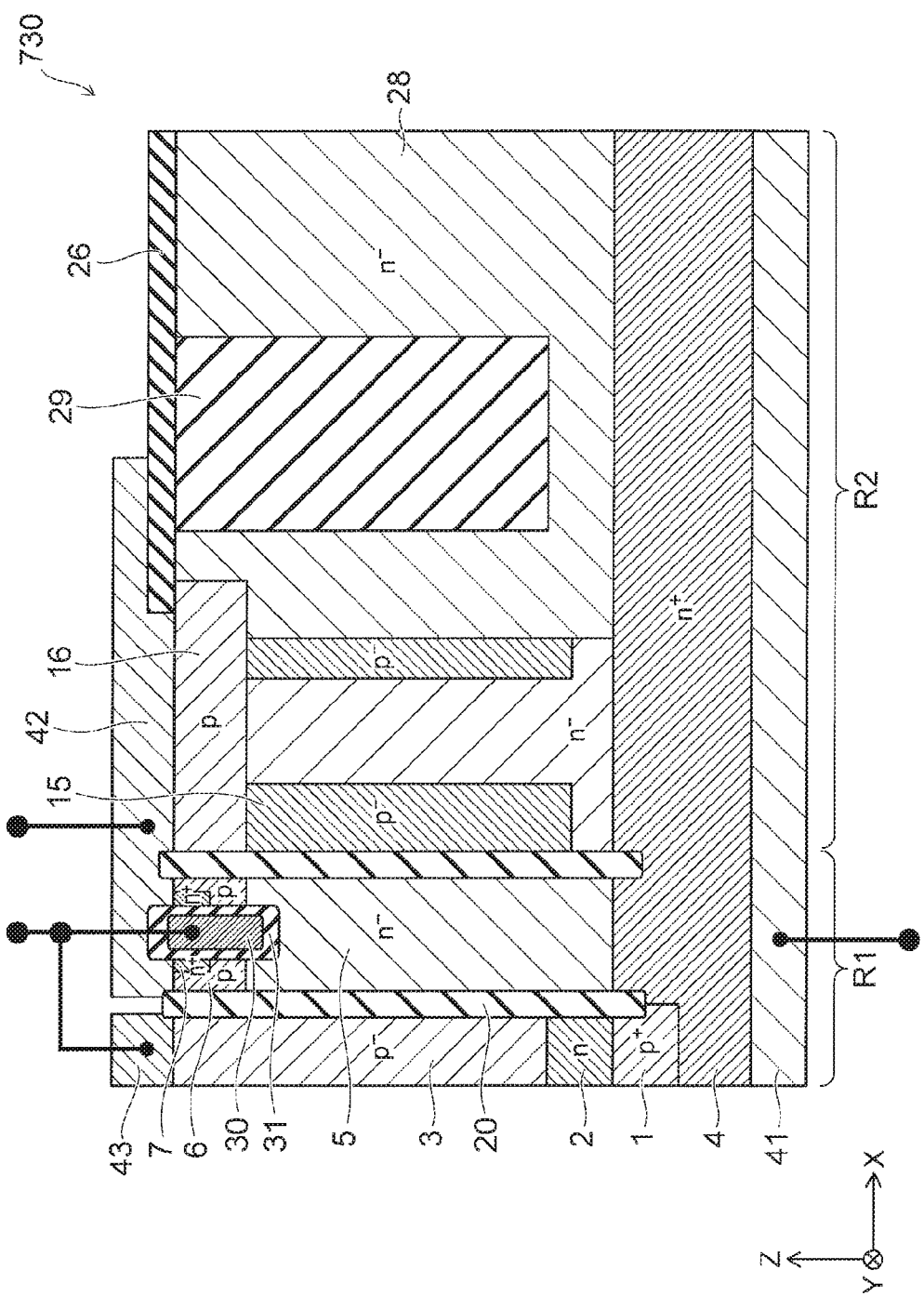
FIG. 31 is a cross-sectional view of a semiconductor device according to a third modification of the seventh embodiment.

FIG. 31 is a cross-sectional view of a semiconductor device 730 according to a third modification of the seventh embodiment.

The plan view of the semiconductor device 730 is the same as those of FIGS. 26 and 27. FIG. 31 corresponds to the cross-sectional view taken along line B-B' of FIG. 27.

The semiconductor device 730 is different from the semiconductor device 720 in that an insulating portion 29 is provided instead of the p$^+$ type semiconductor region 19. The insulating portion 29 is provided in the n$^{--}$ type semiconductor region 28, and positioned around the p type semiconductor region 16. In addition, the insulating portion 29 is provided in a circular shape to surround the element region R1.

Similarly to the semiconductor device 720, it is possible to suppress the concentration of the electric field on the end portion of the p type semiconductor region 16 by providing the insulating portion 29, and the withstand voltage in the termination region R2 can be improved.

A relative level of the impurity concentration between the respective semiconductor regions in the embodiments described above can be confirmed using, for example, an SCM (Scanning Capacitance Microscope).

Further, a concentration of carriers in each semiconductor region can be considered to be equal to the impurity concentration which is activated in each semiconductor region. Therefore, a relative level of the concentration of the carriers in each semiconductor region can also be confirmed using the SCM.

In addition, the impurity concentration in each semiconductor region can be measured using, for example, an SIMS (Secondary Ion Mass Spectrometry).

In the embodiments, the specific configurations of the respective elements, for example, the p$^-$ type pillar region 3, the n$^+$ type drain region 4, the n$^-$ type pillar region 5, the p type base region 6, the n$^+$ type source region 7, the n$^-$ type semiconductor region 14, the p$^-$ type semiconductor region 15, the p type semiconductor region 16, the p$^+$ type semiconductor region 19, the gate electrode 30, the gate insulating layer 31, the drain electrode 41, and the source electrode 42 may be appropriately selected from the techniques which are well known to a person who skilled in the art.

The embodiments explained above can be combined with each other to be carried out.

While certain embodiments have been described, these embodiments have been presented by way of example only, and are not intended to limit the scope of the inventions. Indeed, the novel embodiments described herein may be embodied in a variety of other forms; furthermore, various omissions substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first electrode;
a first semiconductor region of a first conductivity type that is provided on a part of the first electrode;
a second semiconductor region of a second conductivity type that is provided on the first semiconductor region;
a third semiconductor region of a first conductivity type that is provided on the second semiconductor region;
a fourth semiconductor region of a second conductivity type at least a part of which is provided on another part of the first electrode;
a fifth semiconductor region of a second conductivity type that is provided on the fourth semiconductor region;
an insulating portion that is provided between the second semiconductor region and the fifth semiconductor region and between the third semiconductor region and the fifth semiconductor region;
a sixth semiconductor region of a first conductivity type that is provided on the fifth semiconductor region;
a seventh semiconductor region of a second conductivity type that is selectively provided on the sixth semiconductor region;

a gate electrode;
a gate insulating layer that is provided between the gate electrode and each of the fifth semiconductor region, the sixth semiconductor region, and the seventh semiconductor region;
a second electrode that is provided on the seventh semiconductor region and electrically connected to the seventh semiconductor region; and
a third electrode that is provided on the third semiconductor region and electrically connected to the third semiconductor region and the gate electrode.

2. The semiconductor device according to claim 1, wherein the insulating portion includes
a first insulating portion that is arranged with the third semiconductor region in a second direction perpendicular to a first direction extending from the first electrode toward the second electrode, and
a second insulating portion that is arranged with the second semiconductor region in the second direction, and
wherein a thickness of the second insulating portion in the second direction is thicker than that of the first insulating portion in the second direction.

3. The semiconductor device according to claim 1, wherein a part of the fourth semiconductor region is provided between the part of the first electrode and the first semiconductor region.

4. The semiconductor device according to claim 1, wherein a concentration of a second conductive type of carriers in the second semiconductor region is higher than that in the fifth semiconductor region.

5. The semiconductor device according to claim 1, wherein the gate electrode and the gate insulating layer are provided on the insulating portion.

6. The semiconductor device according to claim 1, wherein the seventh semiconductor region is selectively formed at one side surface of the gate insulating layer.

7. The semiconductor device according to claim 1, wherein the seventh semiconductor region contact with the insulating portion.

8. The semiconductor device according to claim 1, further comprising a termination region that is provided around an element region.

9. A semiconductor device comprising:
a first electrode;
a first semiconductor region of a first conductivity type that is provided on a part of the first electrode;
a second semiconductor region of a second conductivity type that is provided on the first semiconductor region;
a third semiconductor region of a first conductivity type that is provided on the second semiconductor region;
a fourth semiconductor region of a second conductivity type at least a part of which is provided on another part of the first electrode;
a fifth semiconductor region of a second conductivity type that is provided on the fourth semiconductor region;
a sixth semiconductor region of a first conductivity type that is provided on the fifth semiconductor region;
an insulating portion provided between the second semiconductor region and the fifth semiconductor region, between the third semiconductor region and the fifth semiconductor region, and between the third semiconductor region and the sixth semiconductor region;
a seventh semiconductor region of a second conductivity type that is selectively provided on the sixth semiconductor region and contact with the insulating portion;
a second electrode that is provided on the seventh semiconductor region and electrically connected to the seventh semiconductor region; and
a gate electrode that is provided on the third semiconductor region and electrically connected to the third semiconductor region.

10. The semiconductor device according to claim 9, wherein the insulating portion includes
a third insulating portion that is arranged with the sixth semiconductor region in a second direction perpendicular to a first direction extending from the first electrode toward the second electrode, and
a fourth insulating portion that is arranged with the fifth semiconductor region in the second direction, and
wherein a thickness of the fourth insulating portion in the second direction is thicker than that of the third insulating portion in the second direction.

11. A semiconductor device comprising:
an insulating portion;
a third semiconductor region of a first conductivity type that is provided on a part of the insulating portion;
a second semiconductor region a second conductivity type that is provided on another part of the insulating portion;
a first semiconductor region of a first conductivity type that is provided on the second semiconductor region to be separated from the third semiconductor region;
a fifth semiconductor region of a second conductivity type that is provided on the insulating portion to be separated from the second semiconductor region and the third semiconductor region;
a second insulating portion that is provided between the second semiconductor region and the fifth semiconductor region and between the third semiconductor region and the fifth semiconductor region;
a sixth semiconductor region of a first conductivity type that is selectively provided on the fifth semiconductor region;
a seventh semiconductor region of a second conductivity type that is selectively provided on the sixth semiconductor region;
a first electrode that is provided on the first semiconductor region and the fifth semiconductor region, and electrically connected to the first semiconductor region and the fifth semiconductor region;
a second electrode that is provided on the seventh semiconductor region and electrically connected to the seventh semiconductor region; and
a third electrode that is electrically connected to the third semiconductor region and the gate electrode.

12. The semiconductor device according to claim 11, further comprising a gate electrode that is provided on the sixth semiconductor region through a gate insulating layer;
wherein the third electrode is provided on the third semiconductor region and electrically connected to the gate electrode.

13. The semiconductor device according to claim 11, wherein the third electrode is arranged with the second electrode in a direction perpendicular to a first direction from the first electrode toward the second electrode.

14. A semiconductor device comprising:
a first electrode;
a first semiconductor region of a first conductivity type that is provided on a part of the first electrode;
a second semiconductor region of a second conductivity type that is provided on the first semiconductor region;

a third semiconductor region of a first conductivity type that is provided on the second semiconductor region;

a pillar semiconductor region of a second conductivity type at least a part of which is provided on another part of the first electrode;

an insulating portion that is provided between the second semiconductor region and the pillar semiconductor region and between the third semiconductor region and the pillar semiconductor region;

a sixth semiconductor region of a first conductivity type that is provided on the pillar semiconductor region;

a seventh semiconductor region of a second conductivity type that is selectively provided on the sixth semiconductor region;

a gate electrode;

a gate insulating layer that is provided between the gate electrode and each of the pillar semiconductor region, the sixth semiconductor region, and the seventh semiconductor region;

a second electrode that is provided on the seventh semiconductor region and electrically connected to the seventh semiconductor region; and a third electrode that is provided on the third semiconductor region and electrically connected to the third semiconductor region and the gate electrode.

15. The semiconductor device according to claim 14, wherein the pillar semiconductor region comprises a fourth semiconductor region and a fifth semiconductor region provided on the fourth semiconductor region, the fourth semiconductor region having higher impurity concentration than the fifth semiconductor region.

* * * * *